(12) United States Patent
Doi et al.

(10) Patent No.: US 6,900,464 B2
(45) Date of Patent: May 31, 2005

(54) THIN FILM TRANSISTOR DEVICE AND METHOD OF MANUFACTURING THE SAME, AND LIQUID CRYSTAL DISPLAY DEVICE

(75) Inventors: Seiji Doi, Kawasaki (JP); Kazushige Hotta, Kawasaki (JP); Takuya Hirano, Kawasaki (JP); Kenichi Yanai, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 0 days.

(21) Appl. No.: 10/314,880

(22) Filed: Dec. 9, 2002

(65) Prior Publication Data

US 2003/0124778 A1 Jul. 3, 2003

(30) Foreign Application Priority Data

Dec. 20, 2001 (JP) ........................................ 2001-388306

(51) Int. Cl.[7] ........................ H01L 29/04; H01L 31/036
(52) U.S. Cl. .............................. 257/72; 257/59; 257/60; 257/61
(58) Field of Search .............................. 257/59–62, 72; 349/38–42; 438/149

(56) References Cited

U.S. PATENT DOCUMENTS

| | | | | |
|---|---|---|---|---|
| 5,953,085 A | * | 9/1999 | Shimada | 349/39 |
| 6,133,967 A | * | 10/2000 | Moon | 349/39 |
| 6,278,131 B1 | * | 8/2001 | Yamazaki et al. | 257/59 |
| 6,590,411 B2 | * | 7/2003 | Lee | 324/770 |
| 6,593,592 B1 | * | 7/2003 | Yamazaki et al. | 257/71 |
| 6,618,033 B2 | * | 9/2003 | Takafuji | 345/96 |
| 2002/0021378 A1 | * | 2/2002 | Murade | 349/43 |
| 2002/0190321 A1 | * | 12/2002 | Yamazaki et al. | 257/347 |

FOREIGN PATENT DOCUMENTS

| | | |
|---|---|---|
| JP | 8-250742 | 9/1996 |
| JP | 2002-305112 | 11/2000 |

* cited by examiner

Primary Examiner—Matthew Smith
Assistant Examiner—Chuong A. Luu
(74) Attorney, Agent, or Firm—Greer, Burns & Crain, Ltd.

(57) ABSTRACT

The present invention relates to a thin film transistor device formed on an insulating substrate of a liquid crystal display device and others, a method of manufacturing the same, and a liquid crystal display device. In structure, there are provided the steps of forming a negative photoresist film on a first insulating film for covering a first island-like semiconductor film, forming a resist mask that has an opening portion in an inner region with respect to a periphery of the first island-like semiconductor film by exposing/developing the negative photoresist film from a back surface side of a transparent substrate, etching the first insulating film in the opening portion of the resist mask, forming a second insulating film for covering the first insulating film and a conductive film thereon, and forming a first gate electrode and a second gate electrode by patterning the conductive film.

4 Claims, 34 Drawing Sheets

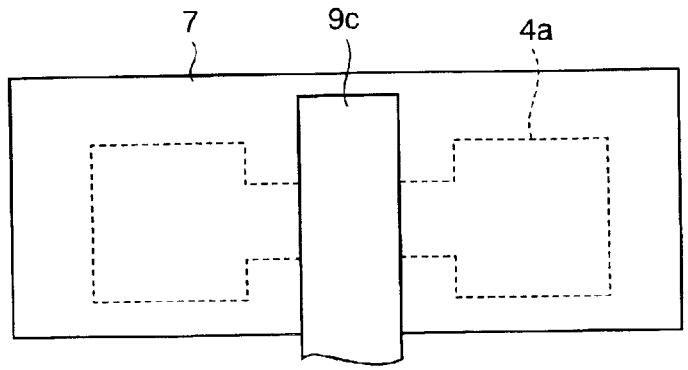
FIG. 4A
(PRIOR ART)
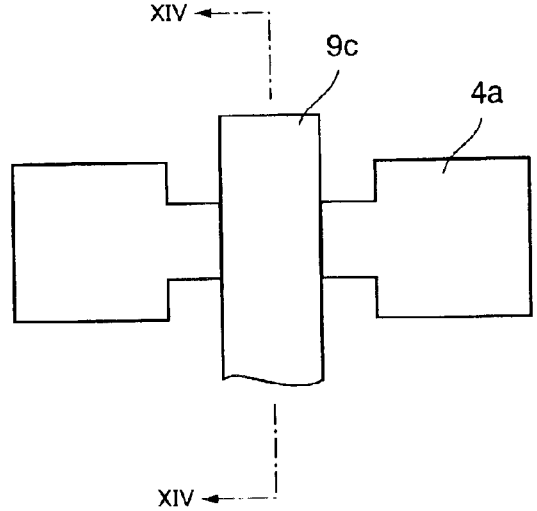
FIG. 4B
(PRIOR ART)
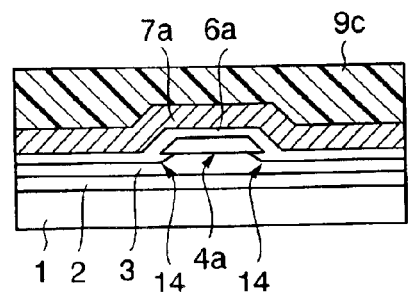

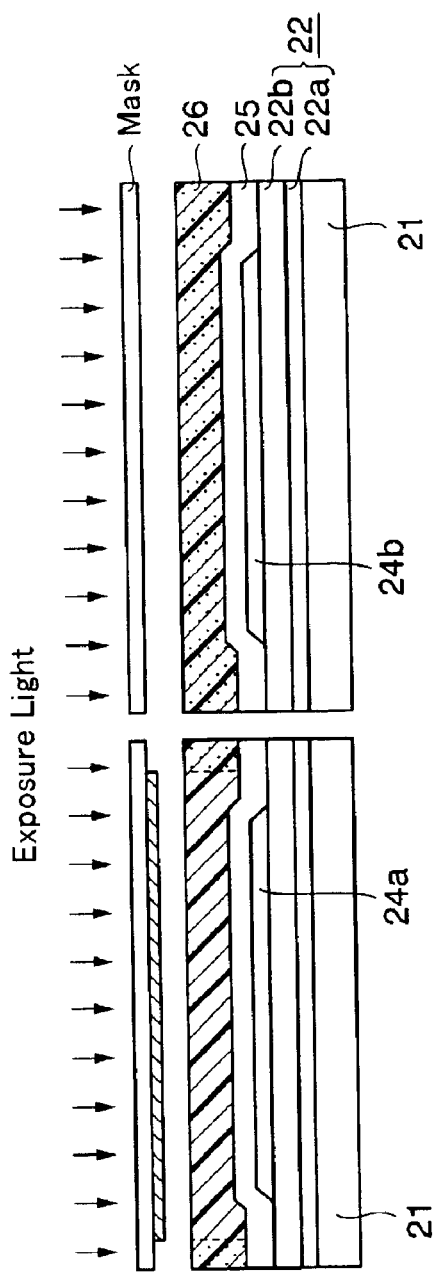
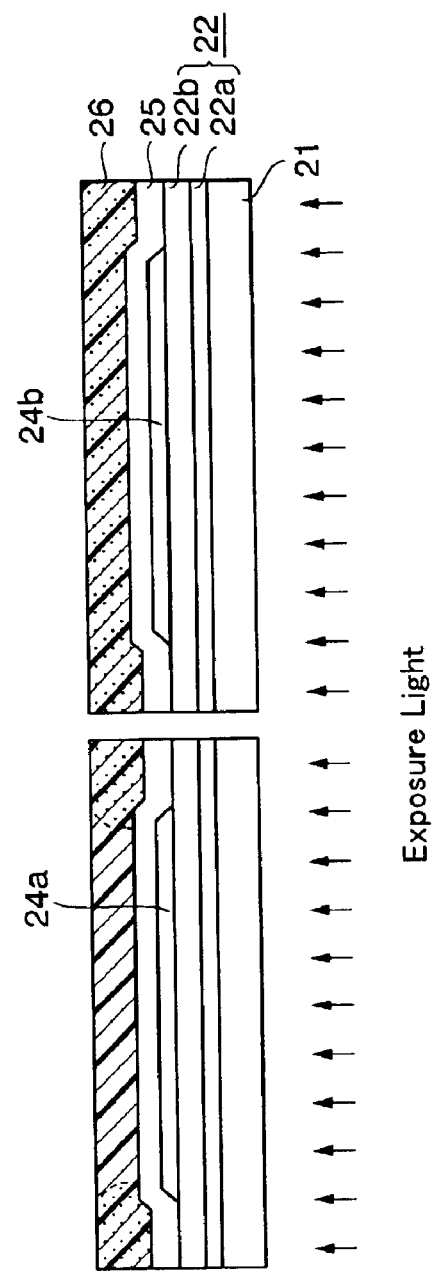
FIG. 9C
FIG. 9D

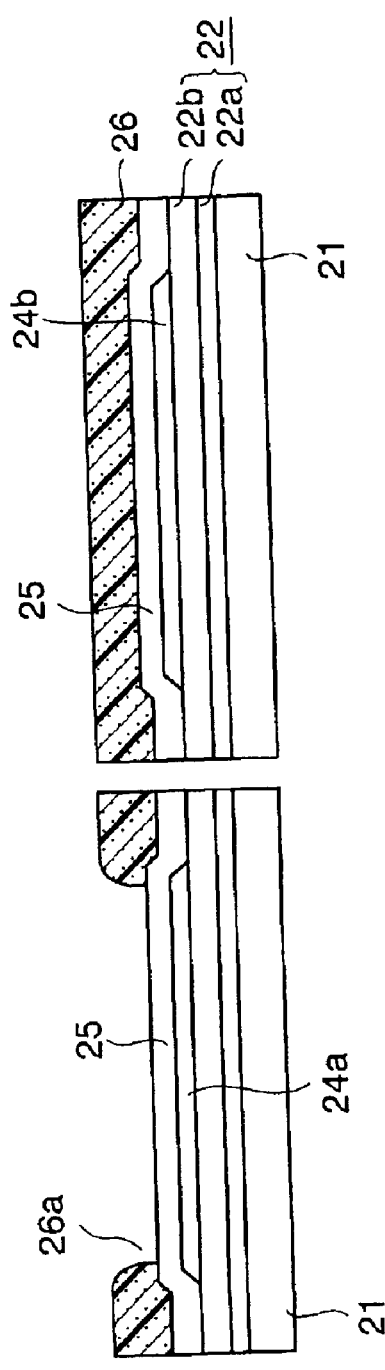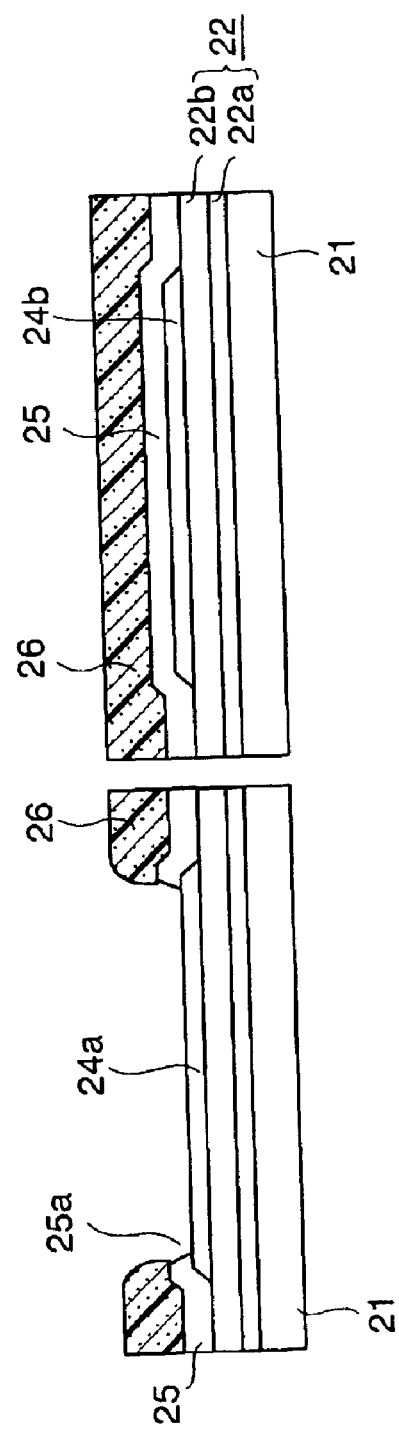

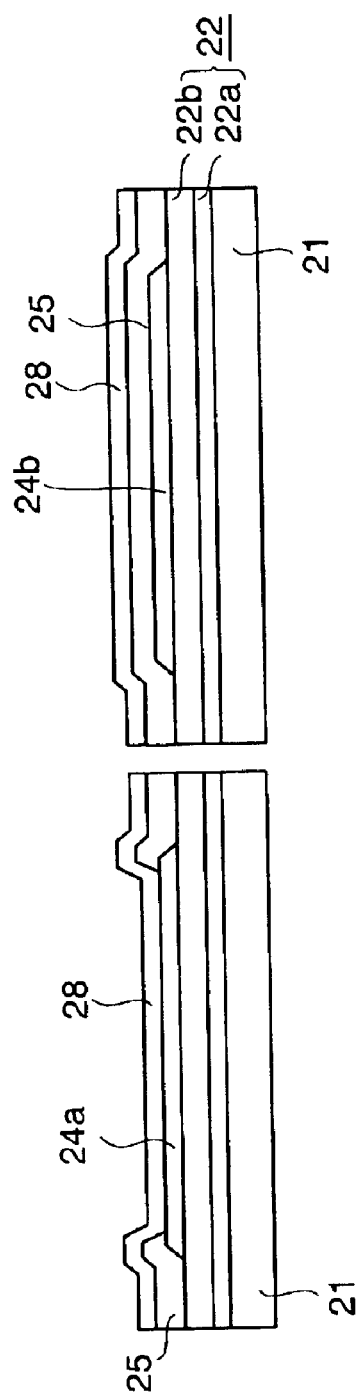
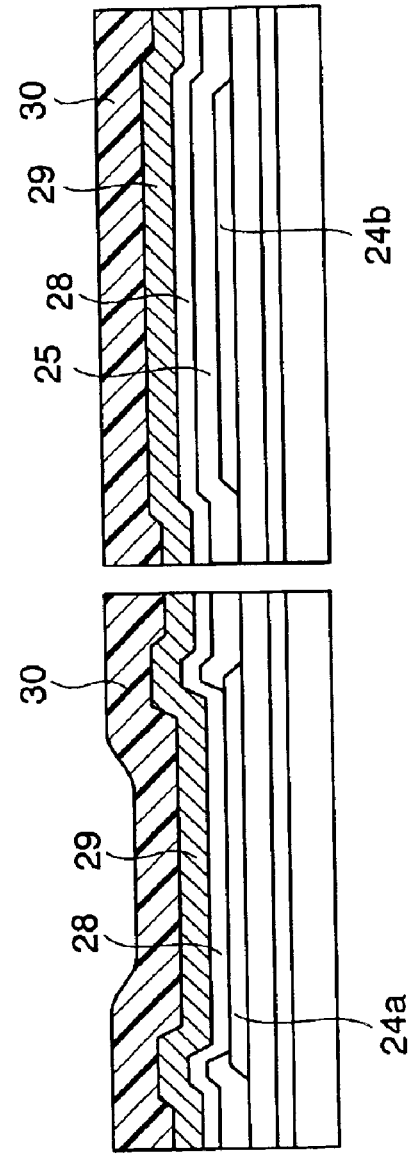
FIG. 9G
FIG. 9H

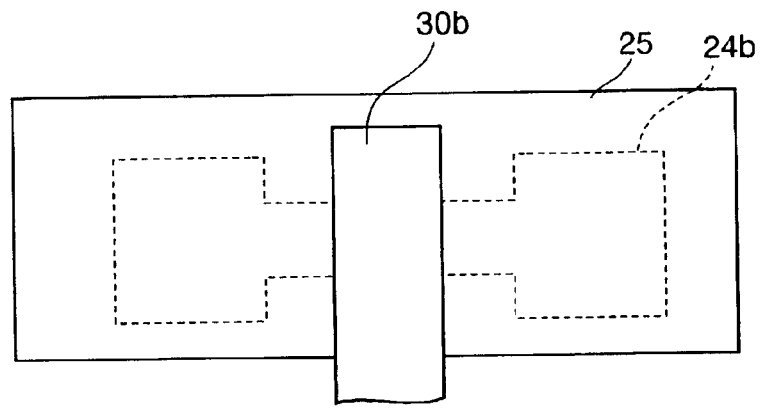
FIG. 11A
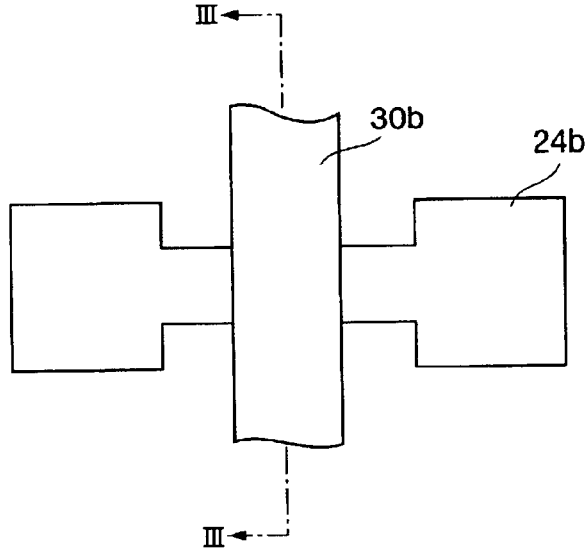
FIG. 11B
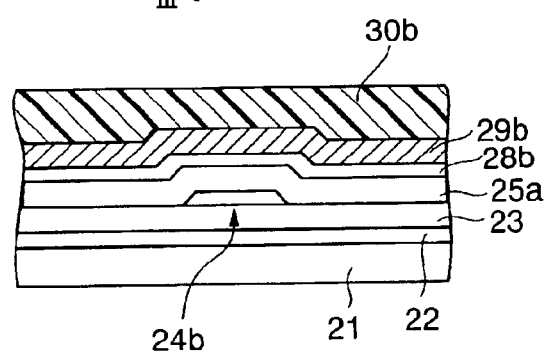

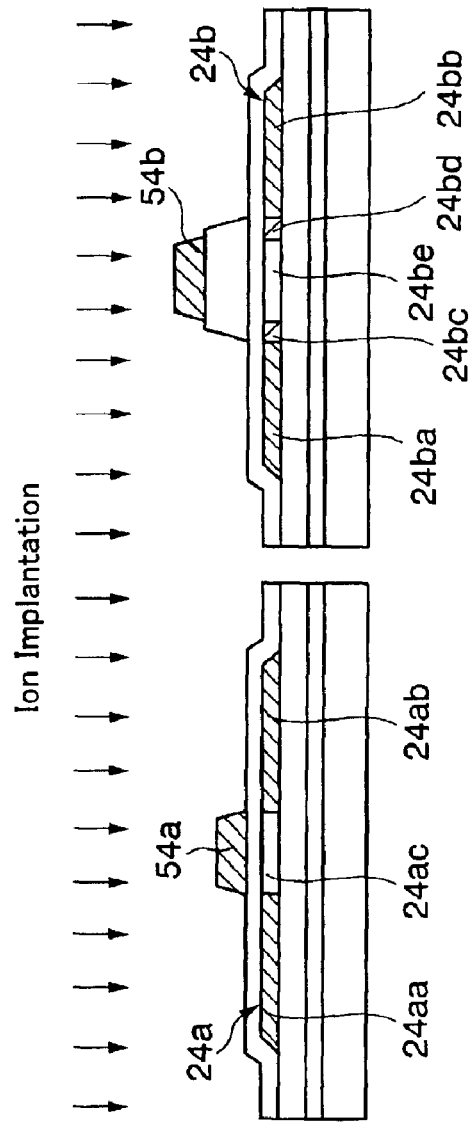
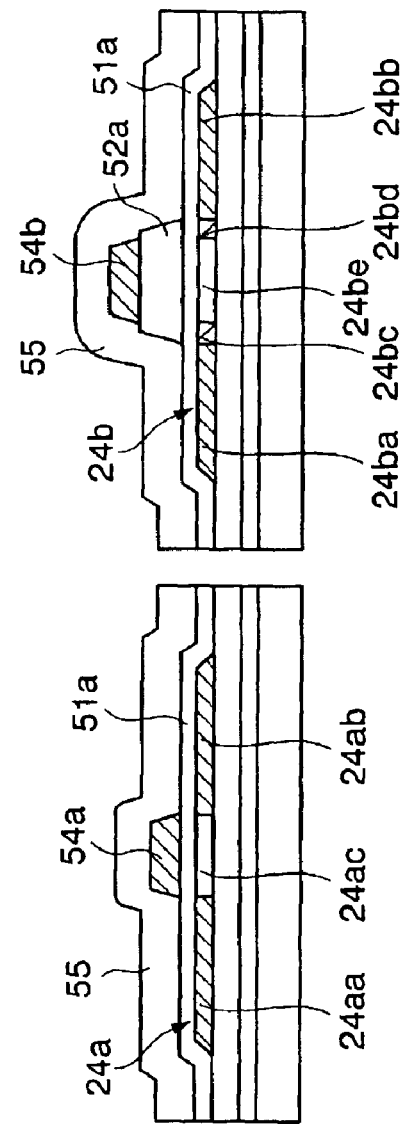
FIG. 12E
FIG. 12F

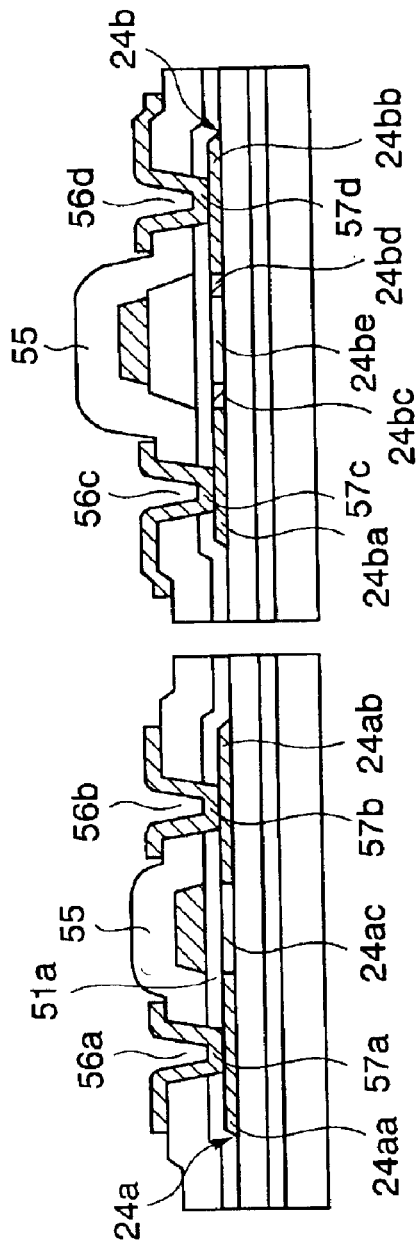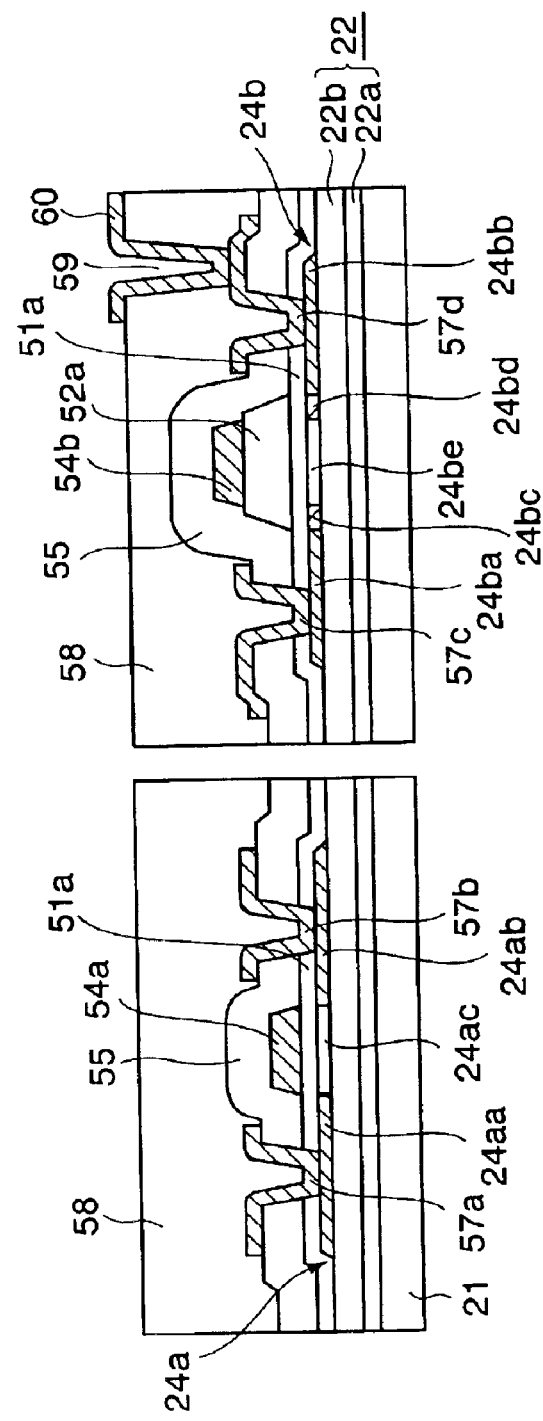
FIG. 12G
FIG. 12H

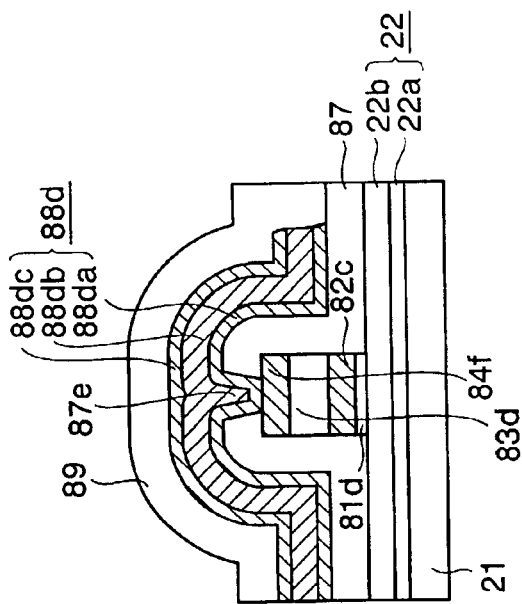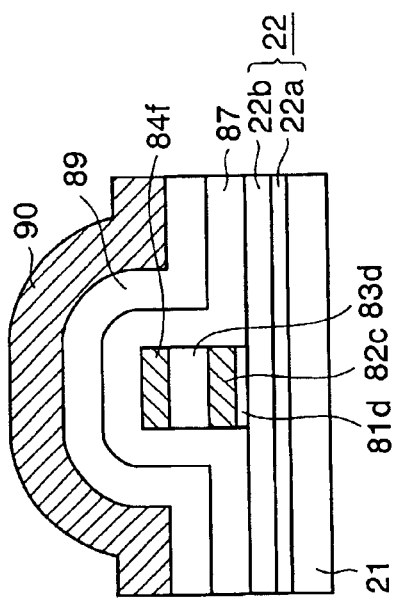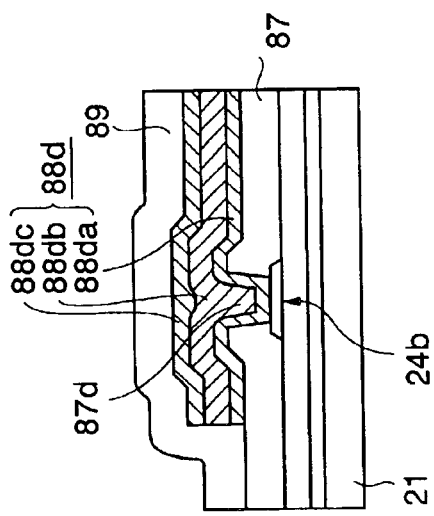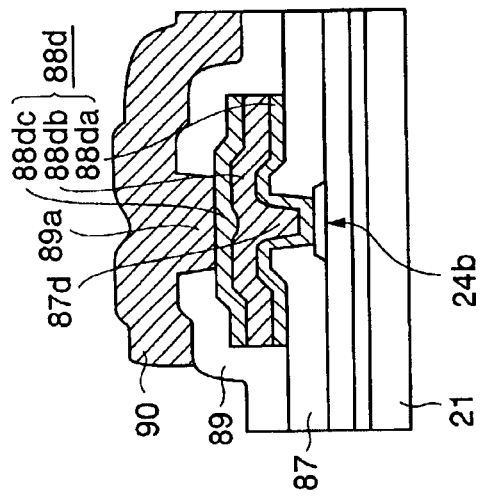
FIG. 19A
FIG. 19B

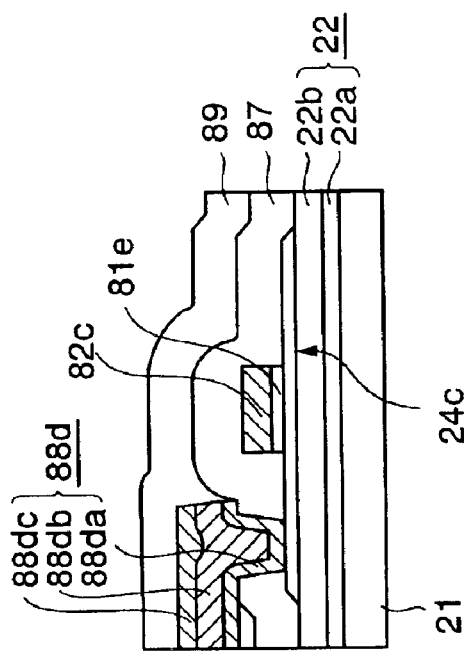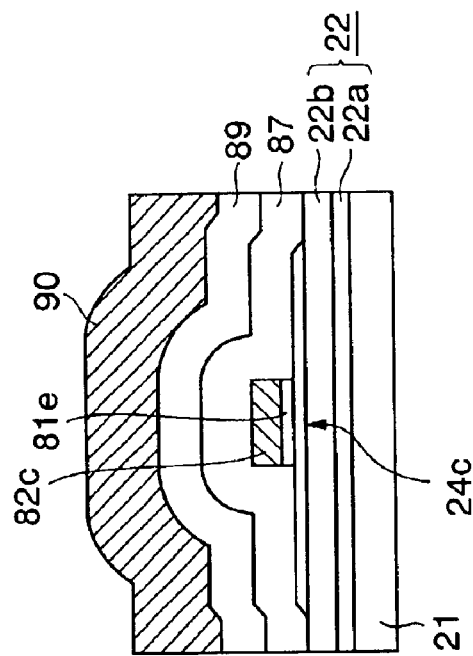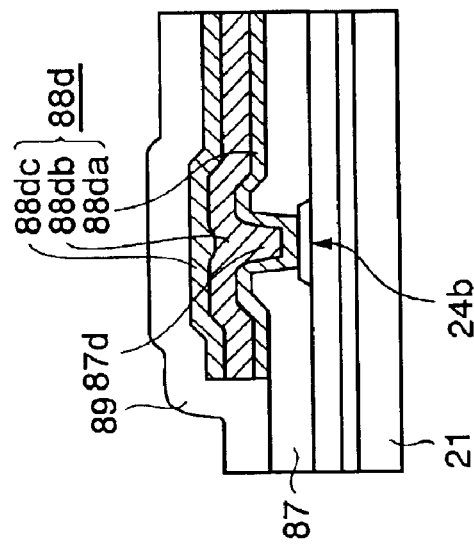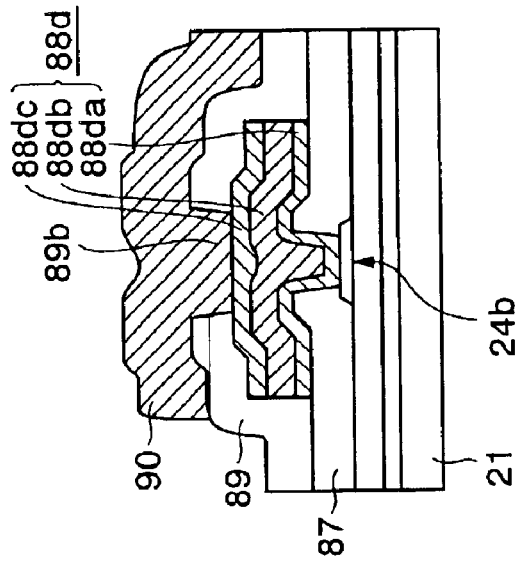
FIG. 21A
FIG. 21B

THIN FILM TRANSISTOR DEVICE AND METHOD OF MANUFACTURING THE SAME, AND LIQUID CRYSTAL DISPLAY DEVICE

CROSS-REFERENCE TO RELATED APPLICATIONS

This application is based upon and claims priority of Japanese Patent Application No. 2001-388306, filed in Dec. 20, 2001, the contents being incorporated herein by reference.

BACKGROUND OF THE INVENTION

1. Field of the Invention

The present invention relates to a thin film transistor device, a method of manufacturing the same, and a liquid crystal display device and, more particularly, a thin film transistor device formed on an insulating substrate of a liquid crystal display device, or the like, a method of manufacturing the same, and a liquid crystal display device.

2. Description of the Prior Art

The liquid crystal display device has features such as light weight, thin thickness, low power consumption, etc., and is put in practice in wide application fields such as the mobile terminal, the viewfinder of the video camera, the notebook-sized personal computer, etc. In particular, the active-matrix liquid crystal display device which uses thin film transistors (abbreviated to "TFTs" hereinafter) as the switching element is often employed in the applications such as the computer display or the like, which require the high-quality and high-definition display.

In the active-matrix liquid crystal display device, the TFT which uses the polysilicon film as the operating layer (referred to as the "pSi-TFT" hereinafter) is employed because of its high driving capability. In recent years, with the progress of the polysilicon film forming technology, the investigation on such a structure that the thin film transistors in the display region (referred to as "pixel TFTs" hereinafter) and the TFTs in the peripheral circuit portion except the display region are formed on the same substrate is now carried out with a view to achieving a lower cost and a higher function.

Since the pixel TFTs are used to drive the liquid crystal, the high voltage must be applied to their gates and drains. Thus, the high breakdown voltage against the gate voltage and the drain voltage is required of such pixel TFTs. On the contrary, the lower power consumption and the high-speed operation are required of the TFTs in the peripheral circuit portion.

In order to achieve this request, in Patent Application Publication (KOKAI) Hei 10-170953, etc., there has been proposed the example in which the pixel TFTs, whose gate insulating film is formed thick, and the TFTs in the peripheral circuit portion, whose gate insulating film is formed thin, are formed on the same substrate.

A sectional structure of the liquid crystal display device in which the thickness of the gate insulating film is different between the pixel TFTs and the TFTs in the peripheral circuit portion, which are formed on the same substrate, is shown in FIG. 1. In this case, the high voltage is also applied to some of the TFTs in the peripheral circuit portion, and thus the same structure as the pixel TFTs is employed in such TFTs in the peripheral circuit portion.

According to the above liquid crystal display device manufacturing method, the gate insulating film made of the silicon oxide film is formed on the island-like semiconductor films $4a$, $4b$ made of the polysilicon film. At that time, the film thickness is adjusted by changing the number of laminated layers of the insulating films in the thick thickness portion and the thin thickness portion. More particularly, as described in the following, a number of insulating films are formed sequentially and also the unnecessary insulating films are etched.

That is, the first insulating film is formed on an overall surface of the substrate. Then, the first insulating film 5 in the TFT forming region in the thick thickness portion is left by the etching, but such first insulating film 5 in other regions is removed.

Then, the second insulating film and the metal film are formed in this order on the overall surface. Then, the metal film is patterned. Thus, in the TFT forming region in the thin thickness portion, the first gate electrode $7a$ is formed on the second insulating film $6a$. Also, in the TFT forming region in the thick thickness portion, the second gate electrode $7b$ is formed on the laminated structure consisting of the first insulating film 5 and the second insulating film $6b$. As a result, in the TFT forming region in the thin thickness portion, the first gate insulating film having the single-layer structure consisting of the second insulating film $6a$ is formed under the first gate electrode $7a$. Also, in the TFT forming region in the thick thickness portion, the second gate insulating film having the double-layered structure consisting of the first and second insulating films 5, $6b$ is formed under the second gate electrode $7b$.

Also, in the TFT in the thick thickness portion, normally the deterioration in the 'ON' characteristic due to the hot carrier should be suppressed and the 'OFF' current should be reduced. For this reason, as shown in FIG. 5, the structure has the LDD (Lightly Doped Drain) structure in which the low-concentration impurity regions $4bc$, $4bd$ are provided in regions between the channel region $4be$ under the gate electrode 75 and the high-concentration impurity regions $4ba$, $4bb$. If viewed from the upper side, the boundaries between the channel region $4be$ and the low-concentration impurity regions $4bc$, $4bd$, are positioned substantially just under the edges of the gate electrode 75. In some cases, the regions that correspond to the low-concentration impurity regions $4bc$, $4bd$ may be formed as the offset region into which the impurity is not introduced.

The normal TFT is formed in the thin thickness portion, and the TFT having the LDD structures is formed in the thick thickness portion. Thus, as shown in FIG. 6A, in the TFT forming region in the thin thickness portion, first the first gate electrode 72 is formed on the first insulating film 71. Then, in the TFT forming region in the thick thickness portion, the resist mask $73a$ whose width is wider than the gate electrode forming region by the LDD region on one side is formed. Then, the ion is implanted by using the first gate electrode 72 and the resist mask $73a$ as a mask. Thus, the high-concentration impurity regions $4aa$, $4ab$ are formed in the island-like semiconductor film $4a$ on both sides of the first gate electrode 72. Also, the high-concentration impurity regions $4ba$, $4bb$ are formed in the island-like semiconductor film $4a$ on both sides of the resist mask $73a$.

Then, the resist mask $73a$ is removed. Then, as shown in FIG. 6B, in the TFT forming region in the thick thickness portion, the new resist mask $73b$ is formed in the region that is narrower than the region in which the resist mask $73a$ is formed. Then, the ion is implanted based on the resist mask $73b$. Thus, the low-concentration impurity regions $4bc$, $4bd$ are formed in the regions between the edges of the resist mask 73b and the edges of the high-concentration impurity regions 4ba, 4bb. In this case, the region that is sandwiched between the low-concentration impurity regions 4bc, 4bd acts as the channel region 4be.

Then, the first insulating film 71 is etched by using the first gate electrode 72 and the resist mask 73b as a mask. Thus, as shown in FIG. 5, the first insulating film 71a is formed under the first gate electrode 72, and the first insulating film 71b is left under the resist mask 73b. Then, the resist mask 73b is removed, and then the second insulating film and the metal film are formed on the overall surface.

Then, the metal film is patterned. Thus, as shown in FIG. 5, in the TFT forming region in the thin thickness portion, the second gate electrode 75 is formed over the channel region 4be. Then, the second insulating film 74a is left by etching the second insulating film while using the second gate electrode 75 as a mask. Thus, the second gate insulating film having the double-layered structure consisting of the first and second insulating films 71b, 74a is formed under the second gate electrode 75.

Subsequently, the thin film transistor device shown in FIG. 5 can be formed via the normal steps. In this case, in FIG. 5, a reference 76 denotes the first interlayer insulating film, 76a to 76d denote the contact hole, 77a to 77d denote the source/drain electrodes, and 78 denotes the second interlayer insulating film.

However, in the manufacturing method in the prior art shown in FIG. 1, as shown in FIG. 2, the first insulating film 5 is etched by the dry etching method. In this case, the surface of the island-like semiconductor film 4a in the TFT forming region in the thin thickness portion, particularly the surface of the channel portion, is exposed to the plasma of the etching gas. Therefore, there is the problem such that, since the damage layer 13 is generated on the surface of the island-like semiconductor film 4a, characteristics of the TFT in the thin thickness portion are deteriorated rather than characteristics of the TFT in the thick thickness portion.

On the contrary, as shown in FIG. 3A, the first insulating film 5 is etched by the wet-etching method using the hydrofluoric acid, or the like. In this case, since it is difficult to get the selective etching ratio of the island-like semiconductor films 4a, 4b to the underlying silicon oxide film 3, such underlying silicon oxide film 3 is also etched at the time of over-etching. As a result, the "scraped portion" 14 is caused in the silicon oxide film 3 under the edge portions of the island-like semiconductor films 4a, 4b.

In order to avoid this event, as shown in FIG. 3B, the second insulating film 6 and the metal film 7 serving as the gate electrode are formed and then, as shown in FIGS. 4A and 4B, the gate electrode 7a is formed by patterning the metal film 7 while using the resist mask 9c. If doing this, the crack is ready to occur in the second insulating film 6a at the scraped portions on the edge portions of the island-like semiconductor film 4a because the gate insulating film of the TFT in the thin thickness portion, which is formed of only the second insulating film 6a, is formed thin. As a result, there is the problem such that the gate breakdown voltage of the TFT in the thin thickness portion is extremely deteriorated.

In addition, the edge portion of the island-like semiconductor film 4a is tapered by the etching to have the top end with an acute angle. For this reason, unless the scraped portion is generated at the edge portion of the island-like semiconductor film 4a, the concentration of the electric field is caused particularly in the TFT in the thin thickness portion when the gate voltage is applied. Thus, there is the problem such that the so-called parasitic TFT is operated more quickly than the normal TFT.

Also, in order to prevent these events, there is employed such a structure that only the edge portions of the island-like semiconductor film 4a of the TFT in the thin thickness portion are covered. Normally, this structure is formed by using the mask-exposure from the upper surface of the substrate 1. In this case, the widths of the island-like semiconductor films 4a, 4b must be set large from a viewpoint of assuring the margin in the mask precision and the alignment precision. As a result, the limit is placed on the miniaturization of the TFT.

In addition, in the manufacturing method in the prior art shown in FIGS. 6A and 6B, the miniaturization makes progress. Therefore, it becomes difficult to form the LDD structure with holding the mutual arrangement among the high-concentration impurity regions 4ba, 4bb, the low-concentration impurity regions 4bc, 4bd, and the gate electrode 75. This prevents the miniaturization.

Further, the multi-layered insulating films 71b, 74a constituting the gate insulating film, as shown in FIG. 5, are etched by separate steps respectively. As a result, these steps take much time and labor, and thus the simplification of these steps is desired.

SUMMARY OF THE INVENTION

First, it is an object of the present invention to provide a thin film transistor device having TFTs whose insulating films have a different thickness respectively on the same substrate and which in thick thickness portions have the LDD structure, and capable of preventing deteriorations in characteristics and a breakdown voltage and also suppressing an operation of a parasitic TFT at edge portions of an operating layer.

Second, it is an object of the present invention to provide a thin film transistor device manufacturing method capable of forming such thin film transistor device, while achieving the simplification of steps and the further miniaturization of the device.

Third, it is an object of the present invention to provide a liquid crystal display device employing the thin film transistor devices.

A thin film transistor device manufacturing method set forth in claim 1 of the present invention, comprises the steps of forming a first island-like semiconductor film and a second island-like semiconductor film on a surface of a transparent substrate; forming a first insulating film for covering the first island-like semiconductor film and the second island-like semiconductor film; forming a negative photoresist film on the first insulating film; exposing the negative photoresist film via a mask that shields an overall region of the first island-like semiconductor film from a light; exposing the negative photoresist film from a back surface side of the transparent substrate; forming a resist pattern, which has an opening portion in an inner region with respect to a periphery of the first island-like semiconductor film, by developing the negative photoresist film; etching the first insulating film in the opening portion of the resist pattern; removing the resist pattern; forming a second insulating film on an overall surface of the transparent substrate on a surface side and then forming a conductive film thereon; forming a first mask pattern on the conductive film over the first island-like semiconductor film and forming a second mask pattern on the conductive film over the second island-like semiconductor film; and forming a first gate electrode by etching the conductive film while using the first mask pattern as a mask and forming a second gate electrode by etching the conductive film while using the second mask pattern as a mask.

According to the present invention, in the forming region of the thin film transistor having the first gate insulating film with a thin thickness, the peripheral portion of the first island-like semiconductor film is covered with the first insulating film prior to the formation of the first gate insulating film. Thus, if the second insulating film acting as the first gate insulating film and the conductive film acting as the first gate electrode are laminated on the first insulating film, the peripheral portion of the first island-like semiconductor film under the first gate electrode is covered with the first insulating film as well as the second insulating film. Therefore, an operation of the parasitic thin film transistor can be prevented by relaxing the electric field concentration at the peripheral portion of the first island-like semiconductor film when the gate voltage is applied.

Also, in the forming region of the thin film transistor having the first gate insulating film with a thin thickness, the exposure light is irradiated onto the unexposed region of the negative photoresist film over the first island-like semiconductor film from the back surface of the transparent substrate while using the first island-like semiconductor film as a mask. Thus, such unexposed region can be exposed in the self-alignment manner within the range into which the light can be diffracted from the periphery of the first island-like semiconductor film. Therefore, the peripheral portion of the first island-like semiconductor film can be covered with the first insulating film with very good precision. As a result, the dimensional margin of the first island-like semiconductor film in the channel-width direction can be minimized, and thus the miniaturization of the thin film transistor can be achieved.

A thin film transistor device manufacturing method set forth in claim 3 of the present invention, comprises the steps of forming a first island-like semiconductor film and a second island-like semiconductor film on a substrate; forming a semiconductor film for covering the first island-like semiconductor film and the second island-like semiconductor film, and then forming an insulating film on the semiconductor film; forming a pattern of the insulating film by selectively etching the insulating film over the second island-like semiconductor film; oxidizing the semiconductor film under the pattern of the insulating film and in other regions to form a first gate insulating film consisting of an insulating film, which is made by oxidizing the semiconductor film, on the first island-like semiconductor film and to form a second gate insulating film consisting of both an insulating film, which is made by oxidizing the semiconductor film, and the pattern of the insulating film on the second island-like semiconductor film; and forming a first gate electrode on the first gate insulating film and forming a second gate electrode on the second gate insulating film.

According to the present invention, when the insulating film serving as a part of the second gate insulating film is formed by etching the insulating film on the semiconductor film, the first island-like semiconductor film is protected by the underlying semiconductor film. Thus, the channel region of the first island-like semiconductor film is not exposed to the plasma of the etching gas of the insulating film. Therefore, the deterioration of the characteristic of the thin film transistor having the first gate insulating film with the thin thickness can be prevented, and thus both the thin film transistor having the second gate insulating film with the thick thickness and the thin film transistor having the first gate insulating film with the thin thickness can assure the good characteristics.

Also, the underlying substrate of the first and second island-like semiconductor films is also protected by the semiconductor film. Therefore, even if the insulating film is formed on the surface of the substrate, the "scraped portion" is not generated at edge portions of the first and second island-like semiconductor films. While if not protected, the "scraped portion" is caused at the edge portions by etching the insulating film on the surface of the substrate.

In addition, when the insulating film serving as a part of the second gate insulating film is formed by etching the insulating film on the semiconductor film, the reduction in film thickness is not generated since the semiconductor film has the etching resistance against the etchant of the insulating film. In this embodiment, since the first gate insulating film is formed by oxidizing the semiconductor film, the film thickness of the first gate insulating film can be controlled easily with good precision.

A thin film transistor device manufacturing method set forth in claim 7 of the present invention, comprises the steps of forming a first semiconductor film on a substrate; forming sequentially a first insulating film, a second semiconductor film, and a second insulating film on the first semiconductor film; forming a pattern of the second insulating film by selectively etching the second insulating film; selectively etching the second semiconductor film to form an island-like second semiconductor film that does not contain the pattern of the second insulating film and an island-like second semiconductor film that contains the pattern of the second insulating film; forming a first island-like second semiconductor film consisting of the first semiconductor film in a region, which is covered with an island-like second semiconductor film that does not contain the pattern of the second insulating film, and also forming a second island-like second semiconductor film consisting of the first semiconductor film in a region, which is covered with the island-like second semiconductor film that contains the pattern of the second insulating film, by oxidizing the island-like second semiconductor film under the pattern of the second insulating film and other region and also oxidizing the first semiconductor film in a region, which is not covered with the island-like second semiconductor film, via the first insulating film, then forming a first gate insulating film consisting of an insulating film, which is made by oxidizing the second semiconductor film, and the first insulating film on the first island-like semiconductor film, and then forming a second gate insulating film consisting of the pattern of the second insulating film, an insulating film, which is made by oxidizing the second semiconductor film, and the first insulating film on the second island-like semiconductor film; and forming a first gate electrode on the first gate insulating film and forming a second gate electrode on the second gate insulating film.

According to the present invention, when the insulating film serving as a part of the second gate insulating film is formed by etching the second insulating film on the second semiconductor film, the first island-like semiconductor film is protected by the underlying second semiconductor film. Thus, the channel region of the first island-like semiconductor film is not exposed to the plasma of the etching gas of the second insulating film. Therefore, the deterioration of the characteristic of the thin film transistor having the first gate insulating film with the thin thickness can be prevented, and thus both the thin film transistor having the second gate insulating film with the thick thickness and the thin film transistor having the first gate insulating film with the thin thickness can assure the good characteristics.

Also, the second insulating film, which acts as the thick thickness portion of the second gate insulating film, on the second semiconductor film is etched. Then, the first and second island-like semiconductor films are formed by oxidizing the second semiconductor film and also oxidizing selectively the first semiconductor film under the second semiconductor film. In this manner, since the surface of the underlying substrate is not exposed to the etching gas, etc., the so-called "scraped portion" is not generated at the edge portions of the first and second island-like semiconductor films.

In addition, when the insulating film serving as a part of the second gate insulating film is formed by etching the second insulating film, the second semiconductor film has the etching resistance against the etchant of the second insulating film and thus the reduction in film thickness is not generated. In this embodiment, since the first gate insulating film is formed of both the insulating film, which is formed by oxidizing the second semiconductor film, and the first insulating film, the film thickness of the first gate insulating film can be controlled easily with good precision.

A thin film transistor device set forth in claim 11 of the present invention, comprises a first thin film transistor including a first island-like semiconductor film having a pair of source/drain regions that are formed to put a channel region therebetween, a first gate insulating film made of a first insulating film formed on the channel region of the first island-like semiconductor film, and a first gate electrode made of a first conductive film formed on the first gate insulating film; and a second thin film transistor including a second island-like semiconductor film having a pair of source/drain regions that are formed to put a channel region therebetween, a second gate insulating film made of the first insulating film and a second insulating film formed on the channel region of the second island-like semiconductor film, and a second gate electrode made of a second conductive film formed on the second gate insulating film, both the first thin film transistor and the second thin film transistor being formed on a same substrate; wherein the first thin film transistor has electric-field relaxation electrodes that are formed of the second conductive film over edges of the first island-like semiconductor film on side portions and on the first gate electrode via the second insulating film, and the second thin film transistor has electric-field relaxation electrodes that are formed of the first conductive film under the second gate electrode and on edges of the second island-like semiconductor film on side portions via the first insulating film.

According to the present invention, in the first thin film transistor, the electric-field relaxation electrodes are provided onto the first gate electrode via the second silicon oxide film and over the edges of the first island-like semiconductor film on both sides. Thus, the parasitic capacitance at this portion becomes large rather than the capacitance, which is formed by the first island-like semiconductor film, the first insulating film, and the first gate electrode, by the electrostatic capacitance, which is formed by the first gate electrode, the second insulating film, and the electric-field relaxation electrodes. Therefore, if the gate of the thin film transistor is driven by the alternative current, the gate potential that is applied to the edge portions of the first island-like semiconductor film on both sides rises slowly. As a result, operations of the parasitic transistors, which are formed at the edge portions of the first island-like semiconductor film on both sides, can be suppressed.

Also, in the second thin film transistor, the electric-field relaxation electrodes are provided under the second gate electrode via the first insulating film and over the edges of the second island-like semiconductor film on both sides. Therefore, if potentials of the electric-field relaxation electrodes are set to the potential at which the channels of the edge portions of the second island-like semiconductor film on both sides do not become conductive, the conduction of the channels of the edge portions of the second island-like semiconductor film on both sides can be suppressed, and also the turning-ON of the parasitic transistors can be suppressed since the influence of the electric field from the second gate electrode can be shielded.

A thin film transistor device manufacturing method set forth in claim 12 of the present invention, comprises the steps of forming a first island-like semiconductor film and a second island-like semiconductor film on a substrate; forming a first insulating film for covering the first island-like semiconductor film and the second island-like semiconductor film; forming a first conductive film on an overall surface, and then forming a first gate electrode on the first insulating film over the first island-like semiconductor film by selectively etching the first conductive film; forming sequentially a second insulating film and a second conductive film on an overall surface; forming a mask pattern on the second conductive film, and then forming a second gate electrode, which is narrower in width than the mask pattern, by side-etching the second conductive film while using the mask pattern as a mask; applying an anisotropic etching to the second insulating film while using the mask pattern as a mask and also applying the anisotropic etching to the first insulating film while using the first gate electrode and the mask pattern as a mask to form a first gate insulating film made of the first insulating film under the first gate electrode and also form a second gate insulating film consisting of the first insulating film and the second insulating film under the second gate electrode; removing the mask pattern; forming high-concentration impurity regions on both sides of the first gate electrode by ion-implanting an impurity into the first island-like semiconductor film while using the first gate electrode as a mask, and also forming a pair of high-concentration impurity regions on both sides of the second gate electrode by ion-implanting the impurity into the second island-like semiconductor film while using the second gate electrode and the second gate insulating film as a mask; and forming a pair of low-concentration impurity regions under the second gate insulating film on both sides of the second gate electrode by ion-implanting the impurity into the second island-like semiconductor film while using the second gate electrode as a mask and under a condition that the ion can transmit through the second gate insulating film in a peripheral portion of the second gate electrode.

According to the present invention, the second gate electrode whose width is narrower than the mask pattern is formed by side-etching the second conductive film based on the mask pattern. In addition, the second gate insulating film whose width is wider than the second gate electrode is formed by anisotropic-etching the first and second insulating films based on the same mask pattern. Then, the high-concentration impurity regions are formed by executing the ion implantation under the conditions that the ion cannot transmit through the second gate electrode and the second gate insulating film. In addition, the low-concentration impurity regions are formed in the second island-like semiconductor film by executing the ion implantation under the conditions that the ion cannot transmit through the second gate electrode but can transmit through the second gate insulating film. Therefore, the low-concentration impurity regions and the high-concentration impurity regions are formed in the second island-like semiconductor film in order from the end of the channel region, so that the channel region under the second gate electrode is put therebetween.

Accordingly, if the width of the side etching is adjusted to have the width necessary for the LDD structure, the LDD structures can be formed in the self-alignment manner by utilizing the gate electrode and the gate insulating film not to increase the number of the exposure masks.

Also, since the first and second gate insulating films having a different film thickness respectively can be formed by one etching step, the simplification of the steps can be achieved. In this case, since the channel regions in the first and second island-like semiconductor films are not exposed to the plasma of the etching gas mutually, generation of the damaged layer on the surfaces of the channel regions in the first and second island-like semiconductor films can be prevented.

A liquid crystal display device set forth in claim 16 of the present invention, comprises a first thin film transistor; a second thin film transistor, the first thin film transistor and the second thin film transistor being formed on a substrate; a pixel electrode connected to source/drain regions of the second thin film transistor; and a storage capacitor bus line that intersects with the pixel electrode; wherein the first thin film transistor includes a first island-like semiconductor film having a pair of source/drain regions formed to put a channel region therebetween, a first gate insulating film made of a first insulating film formed on the channel region of the first island-like semiconductor film, and a first gate electrode made of a first conductive film formed on the first gate insulating film, the second thin film transistor includes a second island-like semiconductor film having a pair of source/drain regions formed to put a channel region therebetween and any one of which is connected to the pixel electrode, a second gate insulating film made of the first insulating film and a second insulating film formed on the channel region of the second island-like semiconductor film, and a second gate electrode made of a second conductive film formed on the second gate insulating film, and the storage capacitor bus line formed of the first conductive film, whereby the second insulating film and the second conductive film connected to the pixel electrode are laminated in this order in a partial area on the storage capacitor bus line.

According to the present invention, the storage capacitor bus line in the display portion is formed by the same material as the first gate electrode of the first thin film transistor. Also, the second insulating film and the second conductive film connected to the pixel electrode are laminated in this order on the storage capacitor bus line. In other words, there is formed the capacitor element in which one electrode is formed by the storage capacitor bus line, the capacitor insulating film is formed by the insulating film made of the same material as the second insulating film of the second gate insulating film, and the other electrode is formed by the second conductive film made of the same material as the second gate electrode.

Therefore, since normally the gate insulating film can be formed thin, it results in obtaining the capacitor element having a higher capacitance per unit area than that of the capacitor element, which has the other electrode made of the ITO film and the capacitor insulating film made of the interlayer insulating film. Further this results in reducing an area of the storage capacitor bus line necessary for the formation of the storage capacitor, i.e., a light shielding area, and thus the aperture ratio can be improved.

A liquid crystal display device set forth in claim 17 of the present invention, comprises a first thin film transistor; a second thin film transistor, the first thin film transistor and the second thin film transistor being formed on a substrate; a pixel electrode connected to source/drain regions of the second thin film transistor; and a storage capacitor bus line that intersects with the pixel electrode; wherein the first thin film transistor includes a first island-like semiconductor film having a pair of source/drain regions formed to put a channel region therebetween, a first gate insulating film made of a first insulating film formed on the channel region of the first island-like semiconductor film, and a first gate electrode made of a first conductive film formed on the first gate insulating film, the second thin film transistor includes a second island-like semiconductor film having a pair of source/drain regions formed to put a channel region therebetween and any one of which is connected to the pixel electrode, a second gate insulating film made of the first insulating film and a second insulating film formed on the channel region of the second island-like semiconductor film, and a second gate electrode made of a second conductive film formed on the second gate insulating film, and the storage capacitor bus line formed of the first conductive film, the storage capacitor bus line provided in a partial area thereof with a third thin film transistor including a gate electrode of the storage capacitor bus line, a third island-like semiconductor film having source/drain regions connected to the pixel electrode, and a gate insulating film made of the first insulating film.

According to the present invention, there are provided the storage capacitor bus line constructed by the first conductive film made of the same material as the first gate electrode, and the third thin film transistor having the gate electrode of the storage capacitor bus line in its partial area thereof. Also, the third thin film transistor has the third island-like semiconductor film having the source/drain regions connected to the pixel electrode therein and the gate insulating film made of the same material as the first insulating film of the second gate insulating film.

If the gate voltage that can always turn the channel ON is applied to the gate electrode, the third island-like semiconductor film can act as the electrode having the low resistance value. It results in the formation of the storage capacitor element having the storage capacitor bus line as one electrode, the first insulating film as the capacitor insulating film, and the third island-like semiconductor film as the other electrode.

Therefore, since normally the gate insulating film is formed thin, it results in obtaining the storage capacitor element having the higher capacitance value per unit area than that of the storage capacitor element which has the ITO film as the other electrode and has the interlayer insulating film as the capacitor insulating film. Further it results in reducing the area of the storage capacitor bus line required to form the storage capacitor, i.e., the light shielding area, and thus the aperture ratio can be improved.

BRIEF DESCRIPTION OF THE DRAWINGS

FIG. 4A is a plan view showing an intermediate step in the thin film transistor device manufacturing method in the prior art, and an upper-side view of FIG. 4B is a plan view showing another intermediate step in the thin film transistor device manufacturing method similarly and a lower-side view of FIG. 4B is a sectional view taken along a XIV—XIV line of this upper-side view;

FIG. 11A is a plan view showing still another intermediate step in the thin film transistor device manufacturing method according to the first embodiment of the present invention, and an upper-side view of FIG. 11B is a plan view showing yet still another intermediate step in the thin film transistor device manufacturing method similarly and a lower-side view of FIG. 11B is a sectional view taken along a III—III line of this upper-side view;

FIGS. 12A to 12H are sectional views showing a thin film transistor device manufacturing method according to a second embodiment of the present invention;

FIG. 19A are sectional views taken along a IX—IX line of FIG. 18 similarly, and FIG. 19B are sectional views taken along a X—X line of FIG. 18 similarly;

FIG. 21A are sectional views taken along a XII—XII line of FIG. 20 similarly, and FIG. 21B are sectional views taken along a XIII—XIII line of FIG. 20 similarly.

DESCRIPTION OF THE PREFERRED EMBODIMENTS

Embodiments of the present invention will be explained with reference to the drawings hereinafter.

First Embodiment
(Structure of the Thin Film Transistor Device)

Figure 1:
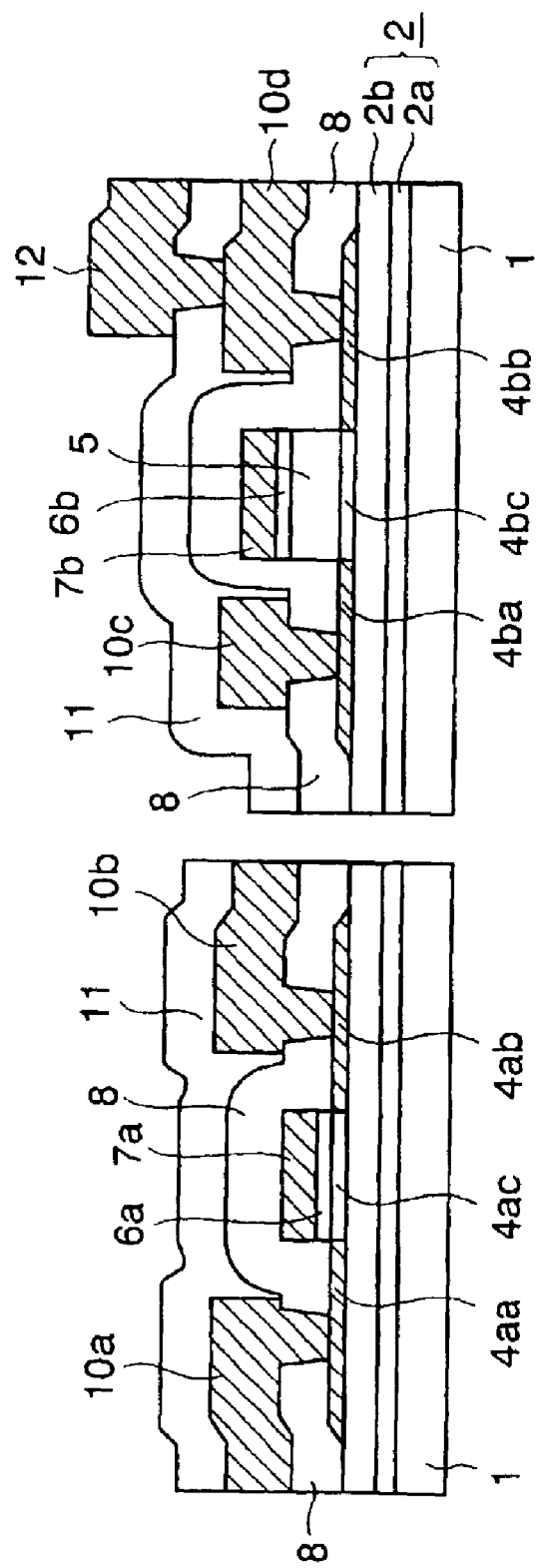
FIG. 1 is a sectional view showing a thin film transistor device in the prior art.
Figure 2:
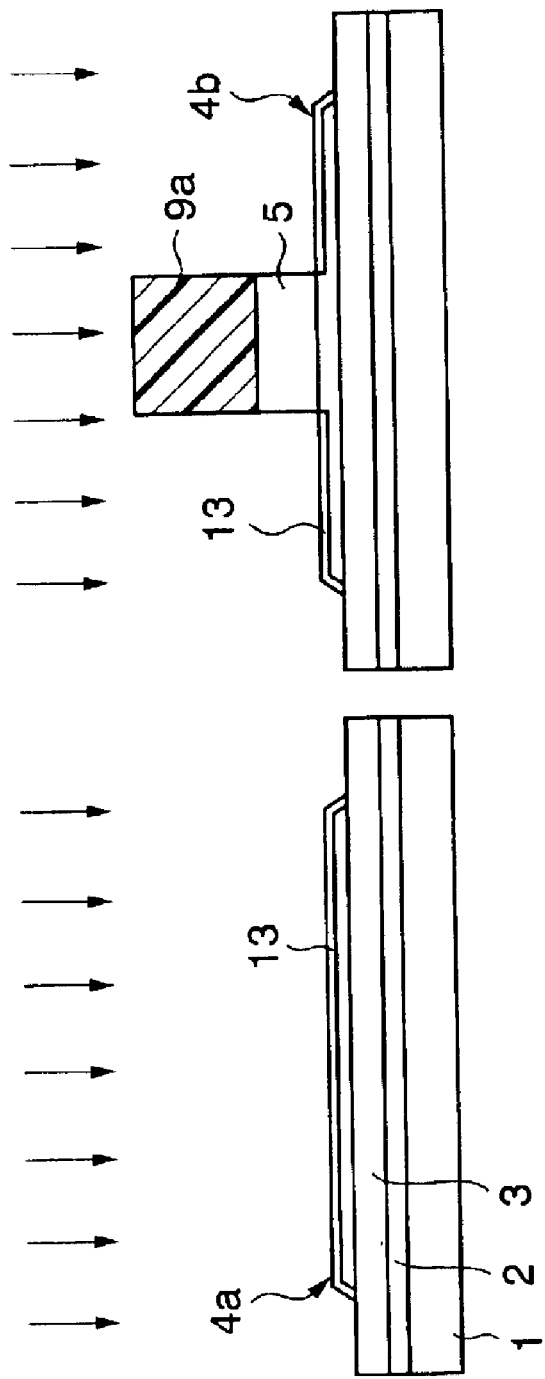
FIG. 2 is a sectional view showing the problem in a thin film transistor device manufacturing method in the prior art.
Figures 3A, 3B:
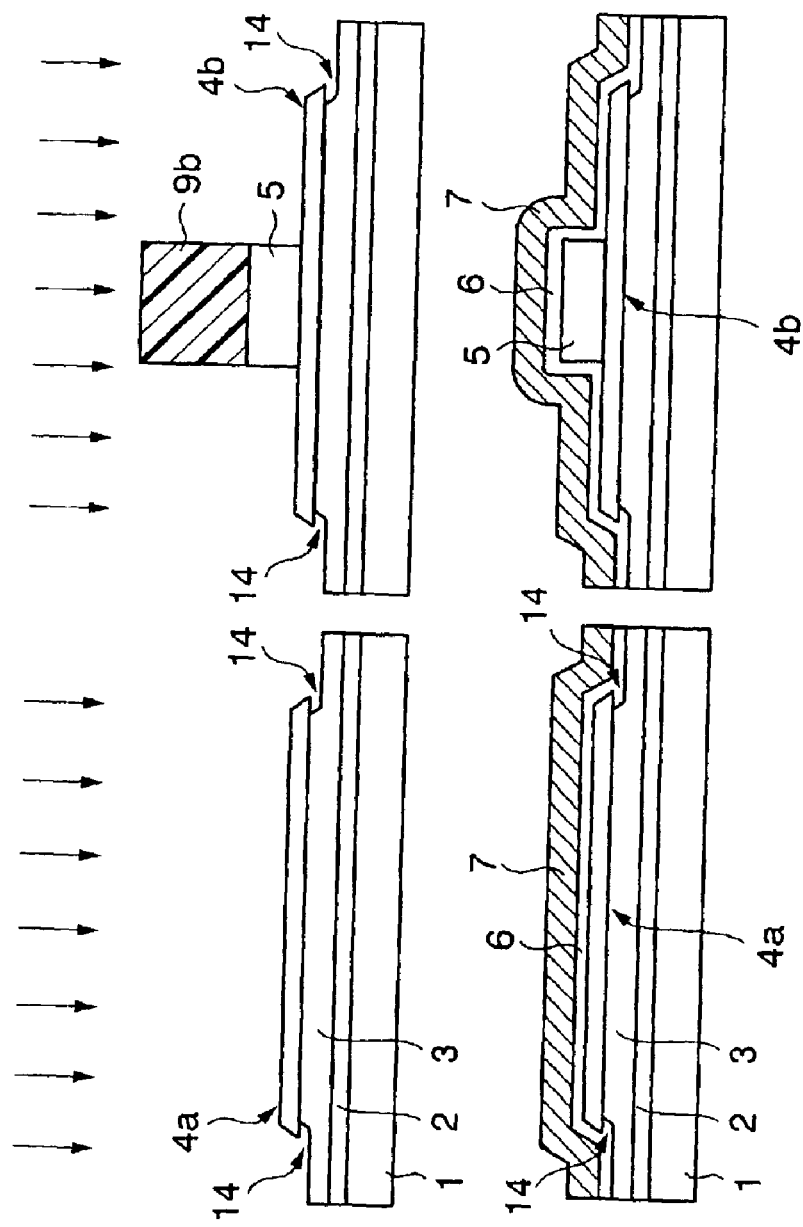
FIGS. 3A and 3B are sectional views showing another problem in the thin film transistor device manufacturing method in the prior art.
Figure 5:
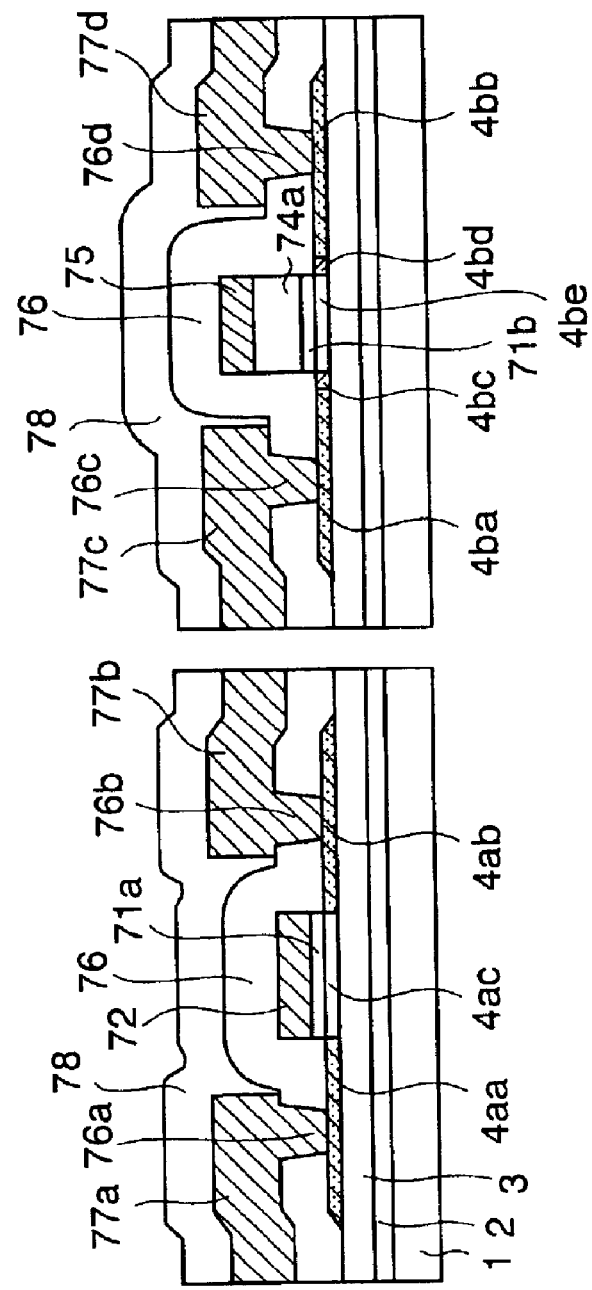
FIG. 5 is a sectional view showing another thin film transistor device in the prior art.
Figures 6A, 6B:
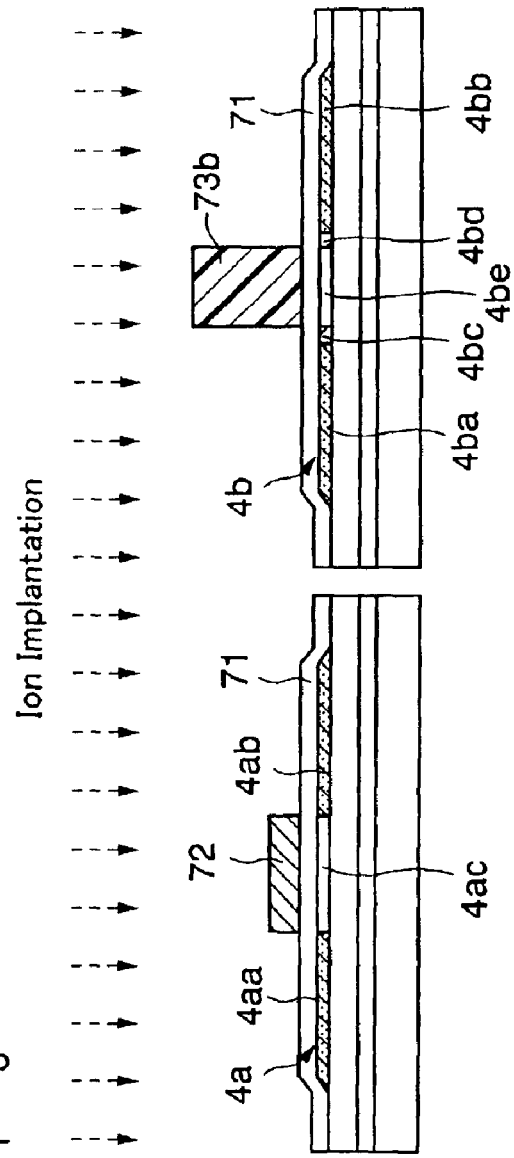
FIGS. 6A and 6B are sectional views showing the problem in another thin film transistor device manufacturing method in the prior art.
Figure 7:
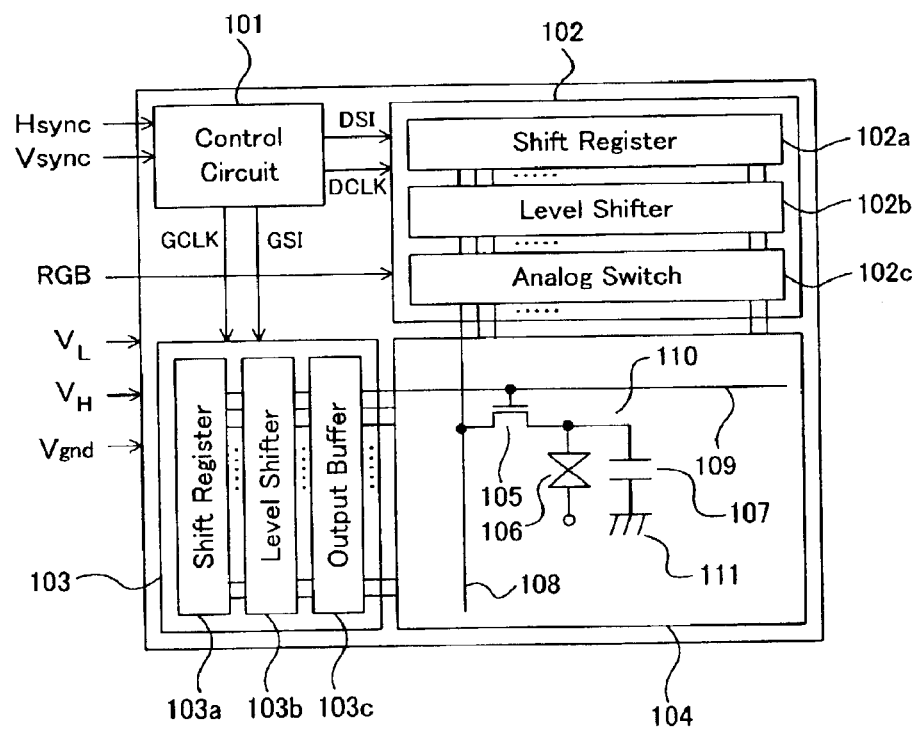
FIG. 7 is a block diagram showing a configuration of a thin film transistor device (transmissive liquid crystal display device) according to a first embodiment of the present invention.
Figure 8:
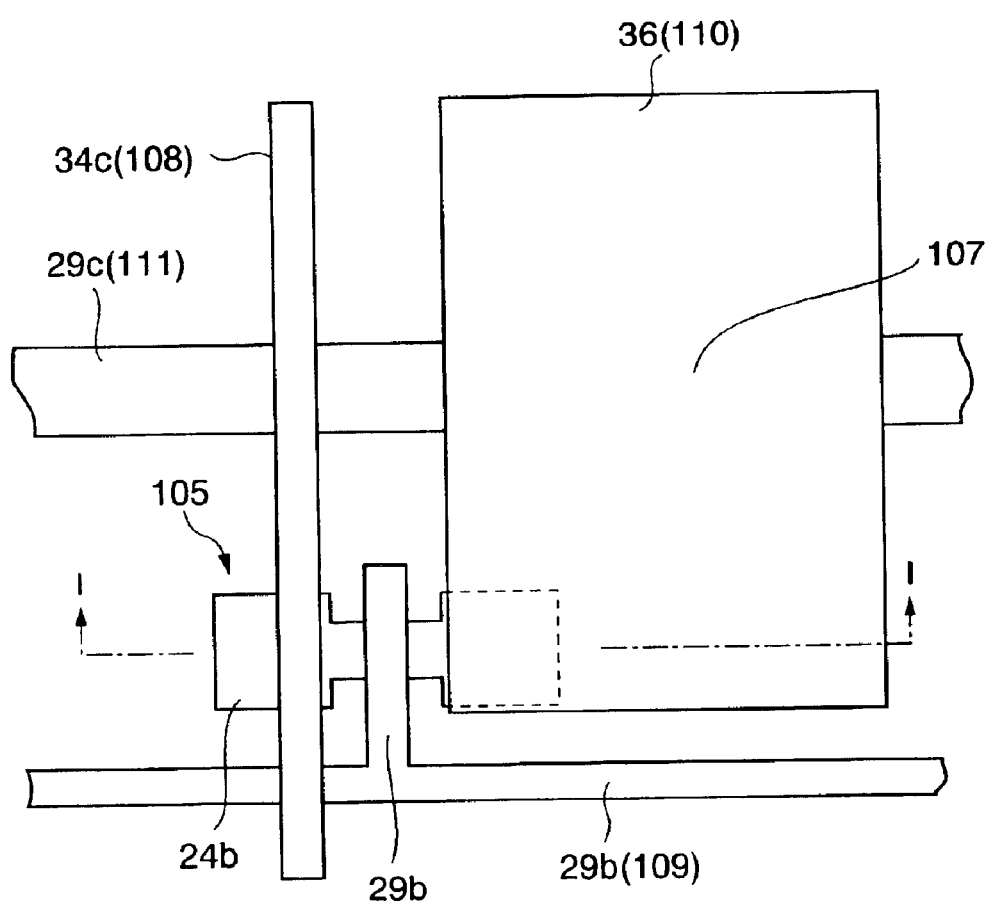
FIG. 8 is a plan view showing the thin film transistor device according to the first embodiment of the present invention.

FIG. 7 is a block diagram showing a configuration of a thin film transistor device (transmissive liquid crystal display device) according to a first embodiment of the present invention. FIG. 8 is a plan view showing a configuration of one pixel of a display portion. In this case, a liquid crystal display device in XGA (1024×768 pixels) mode will be explained in the following example. One pixel consists of three picture elements of R (red color), G (green color), and B (blue color).

The liquid crystal display device in this first embodiment composes a control circuit 101, a data driver 102, a gate driver 103, and a display portion 104. The signals of the display signals RGB, the horizontal synchronizing signal Hsync, the vertical synchronizing signal Vsync, etc. are supplied from external devices (not shown) such as the computer, etc. to this liquid crystal display device. The high voltage $V_H$ (18 V), the low voltage $V_L$ (3.3 V or 5 V), and the ground potential $V_{GND}$ are supplied from the power supplies (not shown).

Here, 3072 (1024×RGB)×768 pixels are arranged in the horizontal direction and the vertical direction in the display portion 104 respectively. Each pixel consists of the n-channel type TFT (referred to as the "n-type TFT" hereinafter. If not particularly mentioned, the recitation of TFT means the n-type TFT.) 105, the display cell (liquid crystal cell) 106 connected to the source electrode of this TFT 105, and the storage capacitor 107.

The display cell 106 consists of a pair of electrodes, one electrode of which is a pixel electrode 110 connected to the source electrode of the TFT 105 and the other electrode of which is an electrode (not shown) provided on the CF substrate, and the liquid crystal (not shown) sealed between these electrodes.

Also, 3072 data bus lines 108 extended in the vertical direction, 768 gate bus lines 109 extended in the horizontal direction, and storage capacitor bus lines 111 extended similarly in the horizontal direction are provided to the display portion 104. The gate electrodes of respective TFTs 105 of the pixels that are aligned in the horizontal direction are connected to the same gate bus line 109. The drain electrodes of respective TFTs 105 of the pixels that are aligned in the vertical direction are connected to the same data bus line 108. Also, the storage capacitor bus line 111 is formed to intersect with the pixel electrode 110, and constitutes one electrode of a pair of electrodes of the storage capacitor 107. The storage capacitor 107 has the pixel electrode 110 and the storage capacitor bus line 111 as a pair of electrodes, and has an interlayer insulating film, which is put between a pair of electrodes, as the capacitor insulating film.

The control circuit 101 receives the horizontal synchronizing signal Hsync and the vertical synchronizing signal Vsync, and then outputs a data start signal DSI that becomes active at the start of one horizontal synchronization period, a data clock DCLK that divides one horizontal synchronization period into predetermined intervals, a gate start signal GSI that becomes active at the start of one vertical synchronization period, and a gate clock GCLK that divides one vertical synchronization period into predetermined intervals. This control circuit 101 is constructed by the n-type TFTs and the p-channel type TFTs (p-type TFTs), both are operated by the low voltage $V_L$.

The data driver 102 consists of a shift register 102a, a level shifter 102b, and an analog switch 102c.

The shift register 102a has 3072 output terminals. This shift register 102a is initialized by the data start signal DSI, and then outputs sequentially an active signal of the low voltage (3.3 V or 5 V) from each output terminal at the timing that is in synchronism with the data clock DCLK. This shift register 102a is constructed by the n-type TFTs and the p-type TFTs, both are operated by the low voltage $V_L$.

The level shifter 102b has 3072 input terminals and 3072 output terminals. This level shifter 102b converts the active signal of the low voltage, which is output from the shift register 102a, into the high voltage (18 V) and then outputs this high voltage. This level shifter 102b is constructed by the n-type TFTs and the p-type TFTs, both are operated by the low voltage $V_L$, and the n-type TFTs and the p-type TFTs, both are operated by the high voltage $V_H$.

The analog switch 102c also has 3072 input terminals and 3072 output terminals. The output terminals of the analog switch 102c are connected to the corresponding data bus lines 108 respectively. When the analog switch 102c receives the active signal from the level shifter 102b, it outputs the display signal RGB (any one of the R signal, the G signal, and the B signal) to the output terminal corresponding to the input terminal that receives the active signal. This analog switch 102c is constructed by the n-type TFTs and the p-type TFTs, both are operated by the high voltage $V_H$.

In other words, the data driver 102 outputs the R signal, the G signal, and the B signal sequentially to the 3072 data bus lines 108 of the display portion 104 in one horizontal synchronization period at the timing that is in synchronism with the data clock DCLK.

The gate driver 103 consists of a shift register 103a, a level shifter 103b, and an output buffer 103c.

The shift register 103a has 768 output terminals. This shift register 103a is initialized by the gate start signal, and then outputs the scanning signal of the low voltage (3.3 V or 5 V) sequentially from each output terminal at the timing that is in synchronism with the gate clock GCLK. This shift register 103a is constructed by the n-type TFTs and the p-type TFTs, both are operated by the low voltage $V_L$.

The level shifter 103b has 768 input terminals and 768 output terminals. Respective output terminals of the output buffer 103c are connected to the corresponding gate bus lines 109 respectively. The output buffer 103c supplies the scanning signal, which is input from the level shifter 103b, to the gate bus line 109 via the output terminal that corresponds to the input terminal. This output buffer 103c is constructed by the n-type TFTs and the p-type TFTs, both are operated by the high voltage $V_H$.

In other words, the gate driver 103 supplies the scanning signal sequentially to the 768 gate bus lines 109 of the display portion 104 in one vertical synchronization period at the timing that is in synchronism with the gate clock GCLK.

The TFT 105 in the display portion 104 is turned ON when the scanning signal is supplied to the gate bus line 109. At this time, when the display signal RGB (any one of the R signal, the G signal, and the B signal) is supplied to the data bus line 108, such display signal RGB is loaded onto the display cell 106 and the storage capacitor 107. Then, the tilt angle of the liquid crystal molecule is changed in the display cell 106 in response to the display signal RGB, and as a result the optical transmittance of the display cell 106 is changed. The desired image can be displayed by controlling the optical transmittance of the display cell 106 every pixel.

In the following embodiments, the TFT provided in the display portion 104 is called the pixel TFT. Also, out of the TFTs provided in the data driver 102 and the gate driver 103, the TFTs that are driven by the high voltage (18 V) is called the high-voltage driving TFT. In addition, out of the TFTs provided in the control circuit 101, the data driver 102 and the gate driver 103, the TFTs that are driven by the low voltage (3.3 V or 5 V) is called the low-voltage driving TFT.

(Structure of the Thin Film Transistor Employed in the Liquid Crystal Display Device)

Structures of above three types of TFTs will be explained hereunder. Here, since the high-voltage driving TFT has the almost same structure as the pixel TFT, the pixel TFT will be explained on behalf of them and explanation of the high-voltage driving TFT will be omitted herein. Also, since the p-type TFT has the almost same structure as the n-type TFT, explanation of the p-type TFT will be omitted herein.

Figure 9A:
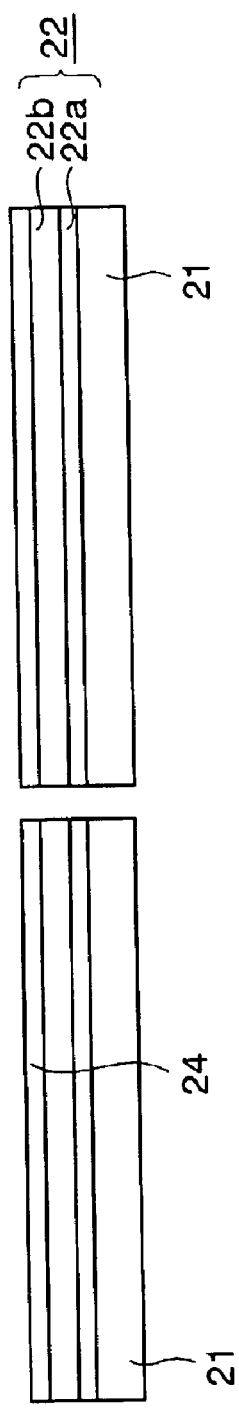
FIGS. 9A to 9P are sectional views showing a thin film transistor device manufacturing method according to the first embodiment of the present invention.
Figure 9B:
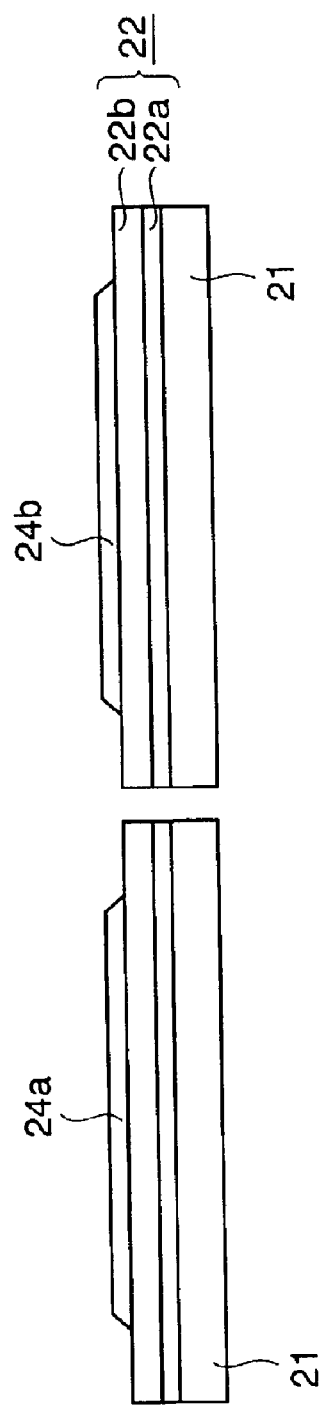
Figure 9I:
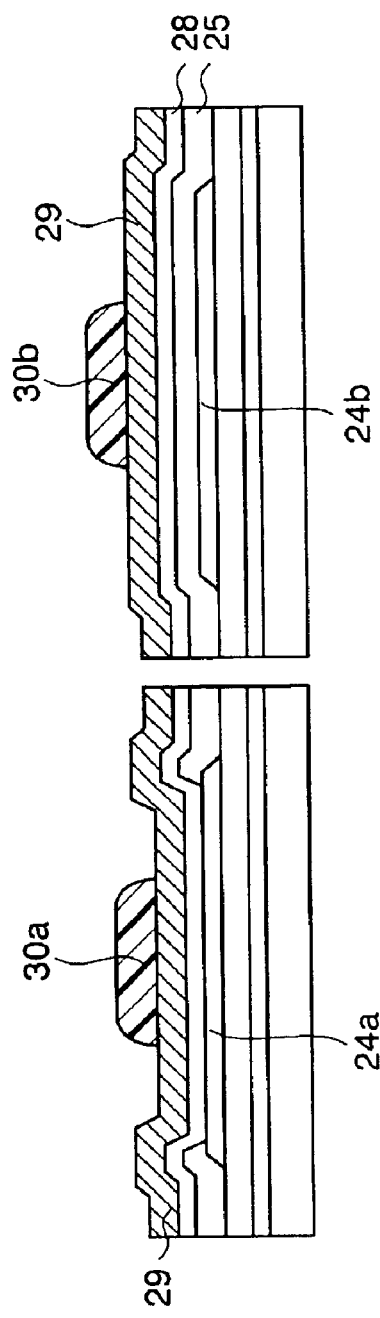
Figure 9J:
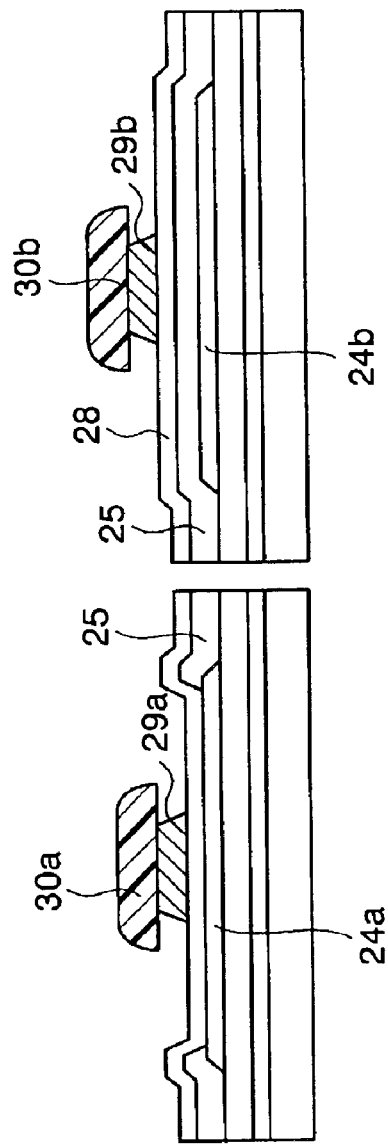
Figure 9K:
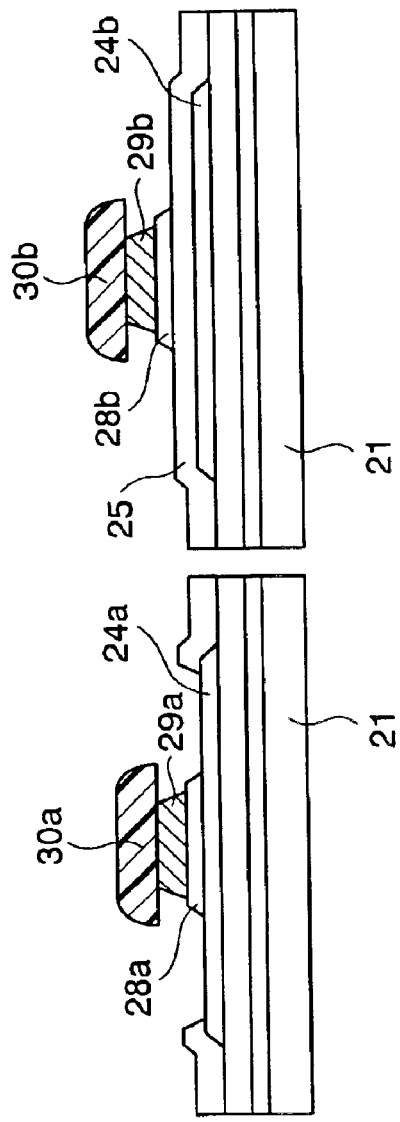
Figure 9L:
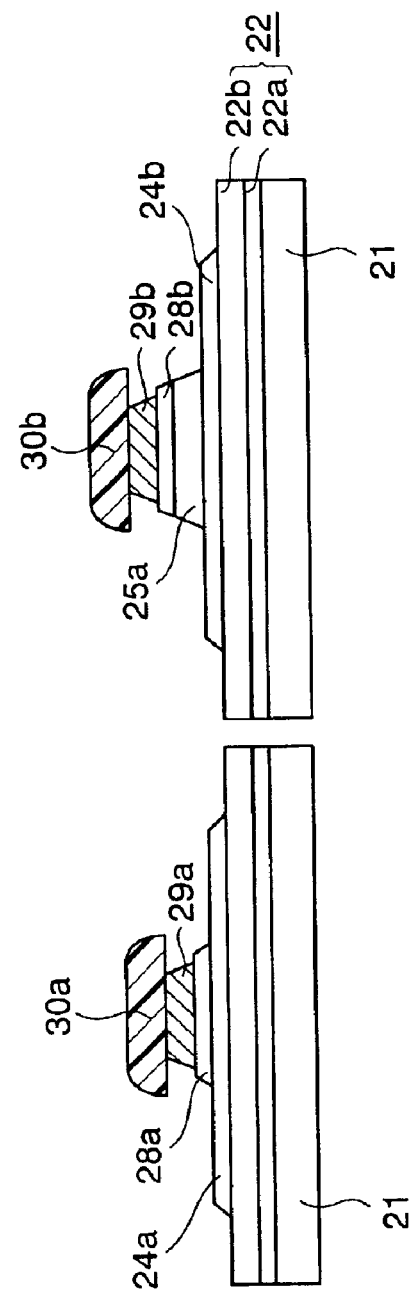
Figure 9M:
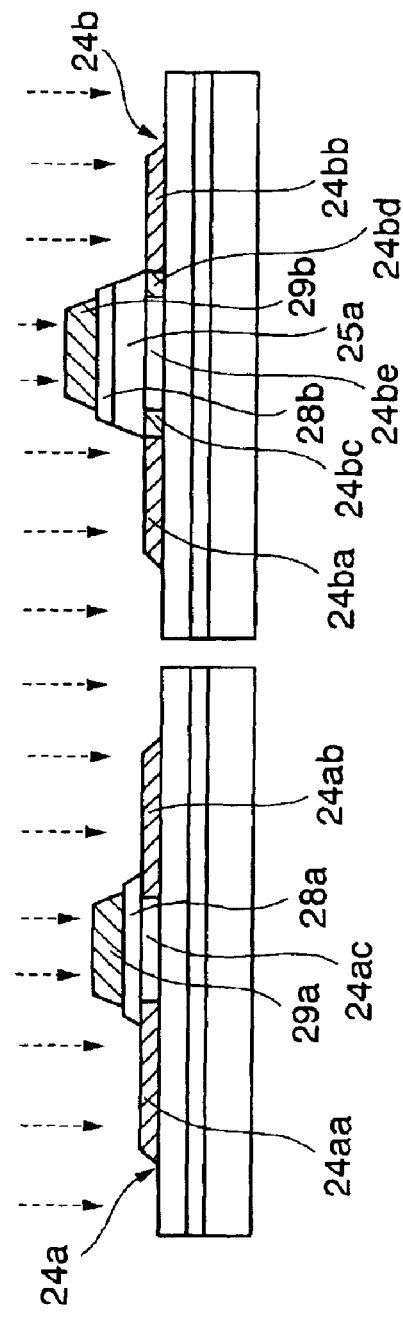
Figure 9N:
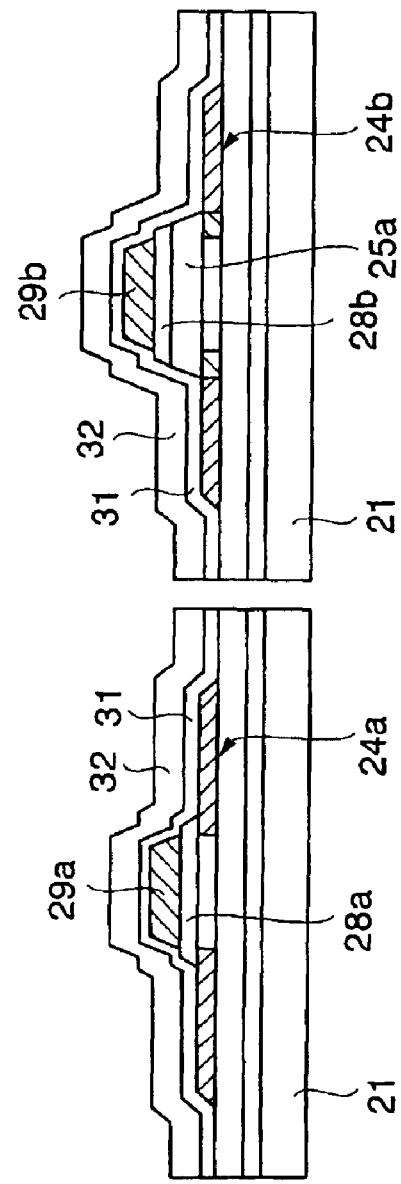
Figure 9O:
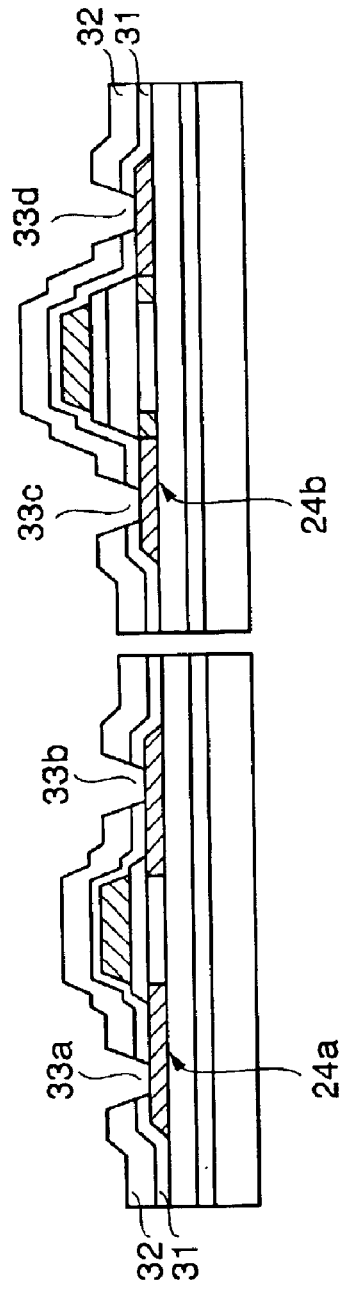
Figure 9P:
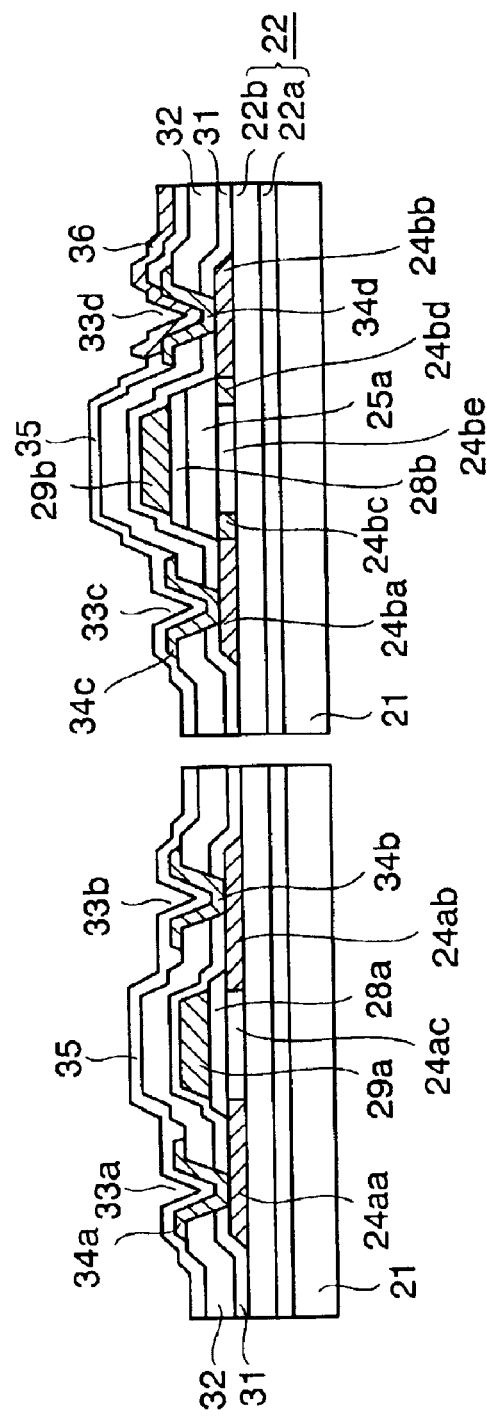

The left-side view of FIG. 9P is a sectional view showing a structure of the low-voltage driving TFT, and the right-side view of the same is a sectional view showing a structure of the pixel TFT. These views show a cross section taken along a I—I line of FIG. 8.

First, as shown in the left-side view of FIG. 9P, in the low-voltage driving TFT, an underlying insulating film 22 having a laminated structure consisting of a silicon nitride film 22a and a silicon oxide film 22b is formed on a glass substrate 21. A first island-like semiconductor film 24a serving as an operating layer of the TFT and made of a polysilicon film is formed on this underlying insulating film 22. A pair of high-concentration impurity regions (ohmic contact regions) 24aa, 24ab serving as the source/drain of the TFT are formed in this first island-like semiconductor film 24a to put a channel region 24ac therebetween.

A gate insulating film made of a silicon oxide ($SiO_2$) film 28a having a thickness of 30 nm is formed on the underlying insulating film 22 and the first island-like semiconductor film 24a. Also, a gate electrode 29a is formed on the silicon oxide film 28a. In the low-voltage driving TFT, both edges of the high-concentration impurity regions 24aa, 24ab on the channel region side are positioned almost just under the edges of the gate electrode 29a. A silicon oxide film 31 of 90 nm thickness and a silicon nitride (SiN) film 32 of 350 nm thickness are laminated on the silicon oxide film 28a and the gate electrode 29a. Electrodes (a source electrode and a drain electrode) 34a, 34b are formed on the silicon nitride film 32. These electrodes 34a, 34b are connected electrically to the high-concentration impurity regions 24aa, 24ab via metals buried in contact holes 33a, 33b, which come up to the high-concentration impurity regions 24aa, 24ab from an upper surface of the silicon nitride film 32, respectively.

As described above, in the low-voltage driving TFT, the gate insulating film is formed only of the silicon oxide film 28a having a thickness of 30 nm and the LDD region is not provided, so that the high-speed operation can be accomplished at the low voltage. Since the high-concentration impurity regions 24aa, 24ab can be formed in a self-alignment manner with the gate electrode 29a, the miniaturization of the device can be made easily. In this case, the LDD region is not provided in the low-voltage driving TFT. However, since such TFT is driven by the low voltage, an amount of hot electrons is small and thus the degradation of the ON characteristic and the increase in the OFF current due to the hot electron can be avoided.

Then, as shown in the right-side view of FIG. 9P, in the pixel TFT, the underlying insulating film 22 having the same laminated structure as the above is formed on the glass substrate 21. A second island-like semiconductor film 24b serving as the operating layer of the TFT and made of the polysilicon film is formed on the underlying insulating film 22. A pair of n-type high-concentration impurity regions (ohmic contact regions) 24ba, 24bb serving as the source/drain of the TFT are formed in the second island-like semiconductor film 24b to put a channel region 24be therebetween. Also, LDD regions 24bc, 24bd as n-type low-concentration impurity regions are formed at end portions of these n-type high-concentration impurity regions 24ba, 24bb on the channel region 24be side.

A gate oxide film made by laminating a silicon oxide film 25a of 90 nm thickness and a silicon oxide film 28b of 30 nm thickness is formed on the underlying insulating film 22 and the second island-like semiconductor film 24b. Then, a gate electrode 29b is formed on the silicon oxide film 28b. The gate electrode 29b is formed integrally with the gate bus line 109. Also, the storage capacitor bus line 111 is formed with the same material as the gate electrode 29b.

In this pixel TFT, edges of the LDD regions 24bc, 24bd on the channel region side, if viewed from the upper side, are positioned almost just under both edges of the gate electrode 29b respectively. In the pixel TFT, since the positive and negative signals are supplied as the display signal, the deterioration of the transistor characteristics due to the hot electron is caused unless the LDD regions 24bc, 24bd are provided on both the source side and the drain side.

The silicon oxide film 31 and the silicon nitride film 32 of 350 nm thickness are formed to cover an exposed surface of the gate electrode 29b. Electrodes (the source/drain electrodes) 34c, 34d are formed on the silicon nitride film 32. These electrodes 34c, 34d are connected electrically to the high-concentration impurity regions 24ba, 24bb via metals buried in contact holes 33c, 33d, which come up to the high-concentration impurity regions 24ba, 24bb from the upper surface of the silicon nitride film 32, respectively. The source/drain electrodes 34c out of a pair of source/drain electrodes 34c, 34d on the drain side are formed integrally with the data bus line 108.

As described above, according to these pixel TFTs, since the gate insulating film is formed of the thick silicon oxide film (the silicon oxide film 25a+the silicon oxide film 28b) whose thickness is 120 nm, the breakdown voltage of pixel TFTs is high and thus such pixel TFTs can be driven by the high voltage.

In this case, in the high-voltage driving TFT explanation of which is omitted herein, a different point from the pixel TFT is that such high-voltage driving TFT has the LDD region only on the drain electrode side to which the high voltage is applied. Also, the LDD region is not provided to the high-voltage driving p-type TFT in the peripheral circuit, explanation of which is omitted herein. The reason for this is that, since the carrier is the hole in the case of the p-type TFT, the hot carrier is seldom generated and thus such hot carrier never interferes with the transistor characteristics unless the LDD region is provided.

(Thin Film Transistor Device Manufacturing Method)

Figure 10A:
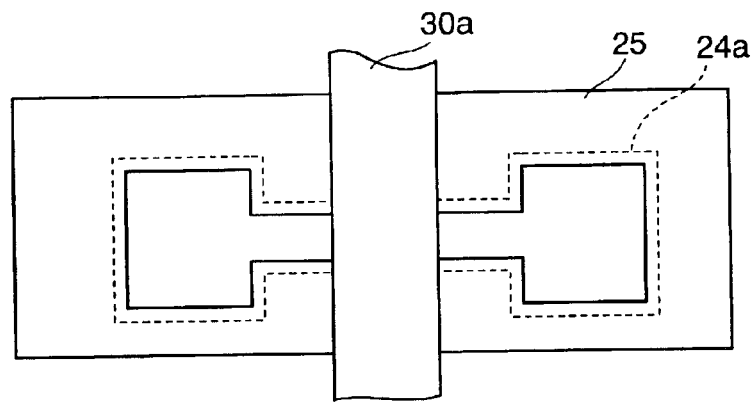
FIG. 10A is a plan view showing an intermediate step in the thin film transistor device manufacturing method according to the first embodiment of the present invention, and an upper-side view of FIG. 10B is a plan view showing another intermediate step in the thin film transistor device manufacturing method similarly and a lower-side view of FIG. 10B is a sectional view taken along a II—II line of this upper-side view.
Figure 10B:
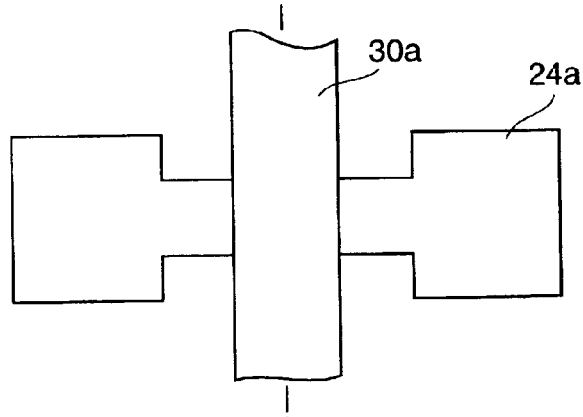
Figure 10B:
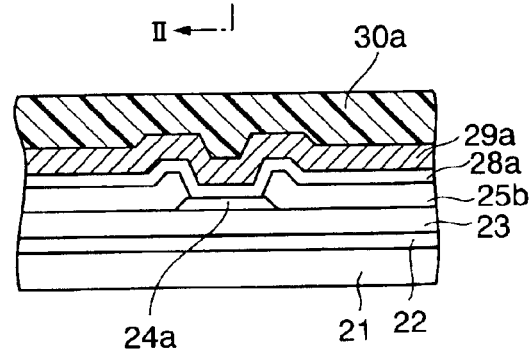

Next, a thin film transistor device manufacturing method according to this first embodiment will be explained with reference to FIGS. 9A to 9P and FIGS. 11A to 11B hereunder. In this case, left-side views of FIGS. 9A to 9P are sectional views in the low-voltage driving TFT forming region, and right-side views of the same are sectional views in the pixel TFT forming region. Also, FIG. 10A is a plan view of FIG. 9K which is halfway through the low-voltage driving TFT manufacturing steps. An upper-side view of FIG. 10B is a plan view of FIG. 9L which is halfway through the low-voltage driving TFT manufacturing steps similarly, and a lower-side view of FIG. 10B is a sectional view taken along a II—II line of this upper-side view. FIG. 11A is a plan view of FIG. 9K which is halfway through the pixel TFT manufacturing steps. An upper-side view of FIG. 11B is a plan view of FIG. 9L which is halfway through the pixel TFT manufacturing steps similarly, and a lower-side view of FIG. 11B is a sectional view taken along a III—III line of this upper-side view.

First, as shown in FIG. 9A, the silicon nitride film 22a of about 50 nm thickness and the silicon oxide film 22b of 200 nm thickness are formed as the underlying insulating film on the glass substrate 21 by the plasma CVD method. Then, an amorphous silicon film 24 of about 50 nm thickness is formed on the silicon oxide film 22b.

Then, in order to reduce the hydrogen in the amorphous silicon film 24, the annealing is executed at the temperature of 450° C. Then, the amorphous silicon film 24 is changed into a polysilicon film by irradiating the excimer laser onto the amorphous silicon film 24.

Then, the photoresist is coated on the polysilicon film, and then a predetermined resist mask (not shown) is formed via the selective exposing and developing steps. Then, as shown in FIG. 9B, the first and second island-like semiconductor films 24a, 24b made of the polysilicon film are left only in predetermined regions by dry-etching the polysilicon film based on this resist mask. Then, the resist mask is removed.

Then, as shown in FIG. 9C, a first silicon oxide film (first insulating film) 25 of 90 nm thickness is formed on an overall upper surface of the glass substrate 21 by the plasma CVD method. Then, a negative photoresist film 26 is formed on the first silicon oxide film 25 by the coating method. Then, the negative photoresist film 26 is exposed by using a mask that can shield an entire area of the first island-like semiconductor film 24a in the low-voltage driving TFT forming region from the light. Thus, the unexposed area of the negative photoresist film 26 is left in the region, which is wider than the first island-like semiconductor film 24a forming region, over the first island-like semiconductor film 24a in the low-voltage driving TFT forming region.

Then, as shown in FIG. 9D, the negative photoresist film 26 is exposed via the glass substrate 21 from the back side. At this time, the exposure light is shielded by the first island-like semiconductor film 24a. Meanwhile, because of the diffraction of the light at the peripheral portion, the negative photoresist film 26 is exposed over the predetermined inner area from the periphery of the first island-like semiconductor film 24a.

Then, as shown in FIG. 9E, the negative photoresist film 26 is developed. Thus, an opening portion 26a is formed in the negative photoresist film 26 in the area on the inner side than the periphery of the first island-like semiconductor film 24a.

Then, as shown in FIG. 9F, the first silicon oxide film 25 is dry-etched via the opening portion 26a that is formed in the negative photoresist film 26 by the development. Thus, an opening portion 25a is formed in the first silicon oxide film 25 in the area on the inner side than the periphery of the first island-like semiconductor film 24a. That is, the first silicon oxide film 25 remains to cover the peripheral portion of the first island-like semiconductor film 24a. Then, the negative photoresist film 26 is removed.

Then, as shown in FIG. 9G, a second silicon oxide film (second insulating film) 28 of 30 nm thickness is formed on an overall upper surface of the glass substrate 21 by the plasma CVD method.

Then, as shown in FIG. 9H, an Al—Nd (aluminum-neodymium: an amount of contained Nd is 2 at. %) film (conductor film) 29 is formed on the second silicon oxide film 28 to have a thickness of about 300 nm. Then, a photoresist film 30 is formed on the Al—Nd film 29.

Then, as shown in FIG. 9I, resist masks 30a, 30b are formed in areas, in which the gate electrodes of respective TFTs are to be formed, by selectively exposing the photoresist film 30 and then developing it. Then, as shown in FIG. 9J, a gate electrode 29a of the low-voltage driving TFT and a gate electrode 29b of the pixel TFT are formed by etching the Al—Nd film 29 based on the resist masks 30a, 30b.

Then, as shown in FIG. 9K, the anisotropic etching is applied to the second silicon oxide film 28 by using the resist masks 30a, 30b. At this time, if viewed from the upper side, the low-voltage driving TFT forming region is depicted as shown in FIG. 10A. Also, if viewed from the upper side, the pixel TFT forming region is depicted as shown in FIG. 11A.

Then, as shown in FIG. 9L, the first silicon oxide film 25, which is left over the glass substrate 21 and is not covered with the resist masks 30a, 30b, is removed by the etching. At this time, in the low-voltage driving TFT forming region, as shown in FIG. 10B, the silicon oxide films 25b, 28a to cover the first island-like semiconductor film 24a still remain under the gate electrode 29a in the area in which the gate electrode 29a goes across the peripheral portion of the first island-like semiconductor film 24a. Also, in the pixel TFT forming region, as shown in FIG. 11B, the silicon oxide films 25a, 28b to cover the second island-like semiconductor film 24b still remain under the gate electrode 29b in the area in which the gate electrode 29b goes across the peripheral portion of the second island-like semiconductor film 24b. In this case, in the high-voltage driving TFT forming region, similarly both the thick silicon oxide film and the thin silicon oxide film to cover the island-like semiconductor film still remain under the gate electrode.

Then, the resist masks 30a, 30b are removed.

Then, as shown in FIG. 9M, the phosphorous (P) is ion-implanted into the first and second island-like semiconductor films 24a, 24b at the acceleration voltage, e.g., of 25 keV, which allows the P ion to transmit through the gate electrodes 29a, 29b and the gate insulating films 28b and 25b but does not allow the P ion to transmit through the gate insulating film 28a, and at the dosage, e.g., of $7 \times 10^{14}$ cm$^{-2}$. Thus, the high-concentration impurity regions (the source/drain regions) 24aa, 24ab are formed in the first island-like semiconductor film 24a in the area which is not covered with the gate electrode 29a in the low-voltage driving TFT forming region. Also, the high-concentration impurity regions (the source/drain regions) 24ba, 24bb are formed in the second island-like semiconductor film 24b in the area which is not covered with the gate electrode 29b and the gate insulating films 28b, 25b in the pixel TFT forming region. At this time, the high-concentration impurity regions (the source/drain regions) are also formed in the island-like semiconductor film in the high-voltage driving TFT forming region.

Then, the phosphorous is ion-implanted at the acceleration voltage, e.g., of 70 keV, which does not allow the P ion to transmit through the gate electrodes 29a, 29b but allow the P ion to transmit through the gate insulating films 28b, 25b, and at the low dosage, e.g., of $2 \times 10^{13}$ cm$^{-2}$. Thus, the low-concentration impurity regions (the low-concentration source/drain regions) 24bc, 24bd are formed between edges of the gate electrode 29b and edges of the gate insulating films 28b, 25b in the pixel TFT forming region. At this time, the LDD regions as the low-concentration impurity regions are also formed on the drain electrode sides in the island-like semiconductor film in the high-voltage driving TFT forming region. In this case, in the low-voltage driving TFT forming region, the acceleration voltage in the ion implantation is high, and thus the ion can transmit through the first island-like semiconductor film 24a. As a result, the impurity is not introduced into the first island-like semiconductor film 24a.

Then, as shown in FIG. 9N, a silicon oxide film 31 of 90 nm thickness is formed on the overall upper surface of the glass substrate 21 by the plasma CVD method. In addition, a silicon nitride film 32 of 350 nm thickness is formed thereon.

Then, as shown in FIG. 9O, there are formed, in the low-voltage driving TFT forming region, contact holes 33a, 33b that pass through the silicon nitride film 32 and the silicon oxide film 31 on the high-concentration impurity regions 24aa, 24ab. Also, there are formed, in the pixel TFT forming region, contact holes 33c, 33d that pass through the silicon nitride film 32 and the silicon oxide film 31 on the high-concentration impurity regions 24ba, 24bb.

Then, as shown in FIG. 9P, a Ti film of 100 nm thickness, an Al film of 200 nm thickness, and a Ti film of 50 nm thickness are deposited sequentially on the overall upper surface of the glass substrate 21. Thus, the contact holes 33a, 33b, 33c, 33d are buried by these metal films and also a metal laminated film is formed on the silicon nitride film 32. Then, a resist mask (not shown) is formed by the photolithography. Then, the metal film is dry-etched based on this resist mask. In this manner, the source/drain electrodes 34a, 34b that come into contact with the high-concentration impurity regions 24aa, 24ab of the low-voltage driving TFT are formed. At the same time, the source/drain electrodes 34c, 34d that come into contact with the high-concentration impurity regions 24ba, 24bb of the pixel TFT are formed.

In this case, in the display portion 104 of the liquid crystal display device, the data bus lines 108 are formed simultaneously with the formation of the source/drain electrodes 34a to 34d. Also, in the area in which the control circuit 101, the data driver 102, and the gate driver 103 are formed, the predetermined wiring patterns are formed simultaneously with the formation of the source/drain electrodes 34a to 34d. In turn, a resin film 35 of 3.0 μm thickness is formed by coating the photosensitive resin.

As described above, the thin film transistor device is completed. In order to fabricate the liquid crystal display device, following steps are executed successively.

Then, a via hole that is communicated to the source/drain electrode 34d via the wiring pattern is formed in a predetermined region of the resin film 35. Then, an ITO (Indium-Tin Oxide) film of 70 nm thickness is formed on the overall upper surface of the glass substrate 21 by the sputter method. Then, a pixel electrode 36 that is connected electrically to the source-side impurity region of the pixel TFT is formed by patterning the ITO film by virtue of the normal photolithography step. Then, an alignment film (not shown) that decides the alignment direction of the liquid crystal molecule in the initial state (at the time of no voltage application) is formed on the overall upper surface of the glass substrate 21.

In this fashion, the TFT substrate of the liquid crystal display device is completed.

The opposing substrate of the liquid crystal display device is formed by the well-known method. More particularly, a black matrix for shielding the areas between the pixels from the light is formed by Cr (chromium), for example, on the glass substrate. Also, color filters of the red color, the green color, and the blue color are formed on the glass substrate such that the color filter having any one color of the red color, the green color, and the blue color is arranged every pixel. Then, a transparent electrode made of the ITO film is formed on the overall upper surface of the glass substrate, and the alignment film is formed on the transparent electrode.

The liquid crystal display panel is constructed by pasting together the TFT substrate and the opposing substrate, which are manufactured in this manner, and then introducing the liquid crystal into a space between them and sealing an introduction port thereof. Then, the liquid crystal display device is completed by arranging the polarization plate on both surfaces of this liquid crystal display panel and arranging a backlight on the back surface side.

As described above, according to the first embodiment of the present invention, as shown in FIG. 9F, in the low-voltage driving TFT forming region, the peripheral portion of the first island-like semiconductor film 24a is covered with the thick silicon oxide film 25, which serves as a part of the thick gate insulating film of the high-voltage driving TFT, prior to the formation of the gate insulating film 28. In this state, subsequently the second silicon oxide film 28 acting as the gate insulating film and the metal film 29 acting as the gate electrode are laminated on the thick silicon oxide film 25. Then, as shown in FIG. 9L, the gate electrode 29a and the gate insulating film 28a are formed by etching based on the stripe-like resist mask 30a that intersects with the first island-like semiconductor film 24a. Thus, as shown in FIG. 10B, the peripheral portion of the first island-like semiconductor film 24a under the gate electrode 29a is covered with the thick silicon oxide film 25b in addition to the silicon oxide film 28a. Therefore, the parasitic TFT can be prevented from being operated by relaxing the electric field concentration at the peripheral portion of the first island-like semiconductor film 24a when the gate voltage is applied.

Also, as shown in FIGS. 9C and 9D, in the low-voltage driving TFT forming region, the exposure light is irradiated onto the unexposed region of the negative photoresist film 26 over the first island-like semiconductor film 24a from the back surface of the glass substrate 21 while using the first island-like semiconductor film 24a as a mask. Thus, such unexposed region can be exposed in the self-alignment fashion within the range into which the light can be diffracted from the periphery of the first island-like semiconductor film 24a. Therefore, the peripheral portion of the first island-like semiconductor film 24a can be covered with the silicon oxide film 25 with very good precision. As a result, the dimensional margin of the first island-like semiconductor film 24a in the channel-width direction can be minimized, and thus the miniaturization of the TFT can be achieved.

Second Embodiment

Next, a second embodiment of the present invention will be explained with reference to the drawings hereunder.
(Structure of the Thin Film Transistor Device Employed in the Liquid Crystal Display Device)

A structure of the thin film transistor device employed in the liquid crystal display device as the second embodiment will be explained with reference to the FIG. 12H hereunder. Here, since the high-voltage driving TFT has the almost same structure as the pixel TFT, the pixel TFT will be explained hereunder on behalf of them and explanation of the high-voltage driving TFT will be omitted herein. Also, since the p-type TFT has the almost same structure as the n-type TFT, its explanation will be omitted herein.

A left-side view of FIG. 12H is a sectional view showing a structure of an n-channel type low-voltage driving TFT, and a right-side view of FIG. 12H is a sectional view showing a structure of an n-channel type pixel TFT.

First, as shown in the left-side view of FIG. 12H, the underlying insulating film 22 having the laminated structure consisting of the silicon nitride film 22a of 50 nm thickness and the silicon oxide film 22b of 200 nm thickness is formed on the glass substrate 21. The first island-like semiconductor film 24a serving as the operating layer of the TFT and made of the polysilicon film having a thickness of 40 nm is formed on this underlying insulating film 22. A pair of high-concentration impurity regions (ohmic contact regions) 24aa, 24ab serving as the source/drain of the TFT are formed in the first island-like semiconductor film 24a to put the channel region 24ac therebetween.

A first gate insulating film 51a made of the silicon oxide film having a thickness of about 30 nm is formed on the underlying insulating film 22 and the first island-like semiconductor film 24a. This silicon oxide film 51a is formed by oxidizing the amorphous silicon film.

Also, a first gate electrode 54a is formed on the first gate insulating film 51a. Both the edges of the high-concentration impurity regions 24aa, 24ab on the channel region side are positioned almost just under the edges of the gate electrode 54a.

A silicon nitride film (first interlayer insulating film) 55 of 370 nm thickness is formed on the first gate insulating film 51a and the first gate electrode 54a. A pair of source/drain electrodes 57a, 57b are formed on the silicon nitride film 55. These source/drain electrodes 57a, 57b are connected electrically to the high-concentration impurity regions 24aa, 24ab via the metals buried in contact holes 56a, 56b, which communicate with the high-concentration impurity regions 24aa, 24ab from an upper surface of the silicon nitride film 55.

As described above, since the first gate insulating film 51a is formed only of the silicon oxide film having a thickness of about 30 nm and also the LDD regions are not provided, the low-voltage driving TFT can execute the high-speed operation at the low voltage. Also, since the high-concentration impurity regions 24aa, 24ab can be formed in the self-alignment manner with the first gate electrode 54a, the miniaturization of the device can be accomplished easily. In this case, the LDD regions are not provided to the low-voltage driving TFT, since an amount of the hot electron is small because such TFT is operated at the low voltage, and thus the deterioration of the ON characteristic and the increase in the OFF current due to the hot electron can be avoided.

Then, as shown in the right-side view of FIG. 12H, in the pixel TFT, the underlying insulating film 22 having the same laminated structure as the above is formed on the glass substrate 21. The second island-like semiconductor film 24b serving as the operating layer of the TFT is formed on the underlying insulating film 22. A pair of n-type high-concentration impurity regions 24ba, 24bb serving as the ohmic contact regions of the source/drain of the TFT are formed in the second island-like semiconductor film 24b to put the channel region 24be therebetween. Also, the n-type low-concentration impurity regions (LDD regions) 24bc, 24bd as are formed at the edge portions of these high-concentration impurity regions 24ba, 24bb on the channel region 24be side respectively.

The silicon oxide film 51a of about 10 nm thickness and a silicon oxide film 52a of 100 nm thickness are laminated on the underlying insulating film 22 and the second island-like semiconductor film 24b. Then, a second gate electrode 54b is formed on the silicon oxide film 52a. The laminated structure consisting of the silicon oxide film 51a and the silicon oxide film 52a under the second gate electrode 54b constitutes the second gate insulating film.

In this pixel TFT, the edges of the LDD regions 24bc, 24bd on the channel region side, if viewed from the upper side, are positioned almost just under both edges of the gate electrode 54b respectively. In the pixel TFT, since the positive and negative signals are supplied as the display signal, the deterioration of the transistor characteristics due to the hot electron is caused unless the LDD regions 24bc, 24bd are provided on both the source side and the drain side.

The silicon nitride film 55 of 370 nm thickness is formed on the second gate electrode 54b and the silicon insulating film 51a. A pair of source/drain electrodes 57c, 57d are formed on the silicon nitride film 55. These source/drain electrodes 57c, 57d are brought into contact with the high-concentration impurity regions 24ba, 24bb via contact holes 56c, 56d.

As described above, according to the above pixel TFT, since the second gate insulating film is formed of the thick silicon oxide film (the silicon oxide film 51a+the silicon oxide film 52a) whose thickness is 110 nm, the breakdown voltage of pixel TFT is high and thus such pixel TFT can be driven by the high voltage.

In this case, in the high-voltage driving TFT the explanation of which is omitted herein, a different point from the pixel TFT is that such high-voltage driving TFT has the LDD region only on the drain electrode side to which the high voltage is applied. Also, the LDD region is not provided to the high-voltage driving p-type TFT in the peripheral circuit, explanation of which is omitted herein. The reason for this is that, since the carrier is the hole in the case of the p-type TFT, the hot carrier is seldom generated and thus such hot carrier never interferes with the transistor characteristics even unless the LDD region is provided.

(Thin Transistor Manufacturing Method Employed in the Liquid Crystal Display Device)

Next, the thin film transistor device manufacturing method employed in the liquid crystal display device according to the present embodiment will be explained with reference to FIGS. 12A to 12H hereunder. Left-side views of FIGS. 12A to 12H are sectional views showing the low-voltage driving TFT forming region, and right-side views of the same are sectional views showing the pixel TFT forming region.

Figure 12A:
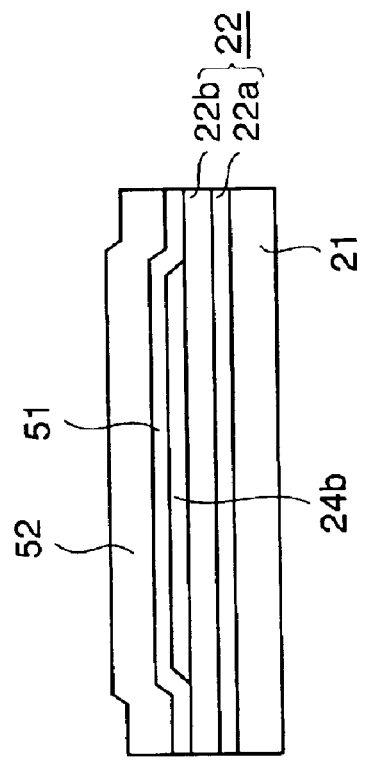
Figure 12A:
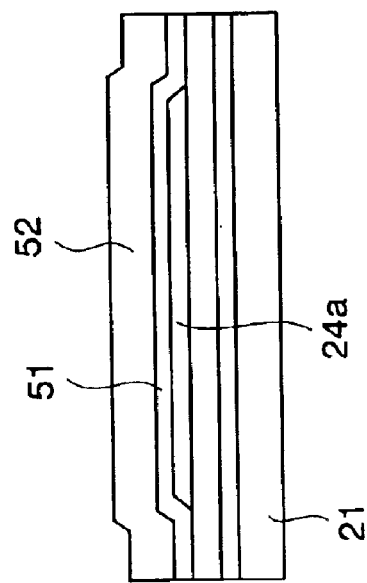

First, as shown in FIG. 12A, the silicon nitride film 22a of about 50 nm thickness and the silicon oxide film 22b of 200 nm thickness are formed sequentially as the underlying insulating film on the glass substrate 21 by the plasma CVD method. Then, the amorphous silicon film of about 40 nm thickness is formed on the silicon oxide film 22b.

Then, in order to reduce the hydrogen in the amorphous silicon film, the annealing is executed at the temperature of 450° C. Then, the amorphous silicon film is changed into the polysilicon film by irradiating the excimer laser onto the amorphous silicon film.

Then, the photoresist is coated on the polysilicon film, and then the predetermined resist mask (not shown) is formed via the exposing and developing steps. Then, the first island-like semiconductor film 24a and the second island-like semiconductor film 24b made of the polysilicon film are left only in predetermined regions by dry-etching the polysilicon film based on this resist mask. Then, the resist mask is removed.

Then, the amorphous silicon film 51 of 10 nm thickness is formed on the overall surface on the upper side of the glass substrate 21 by the plasma CVD method. Then, the silicon oxide film (insulating film) 52 is formed to have a thickness of 100 nm.

Figure 12B:
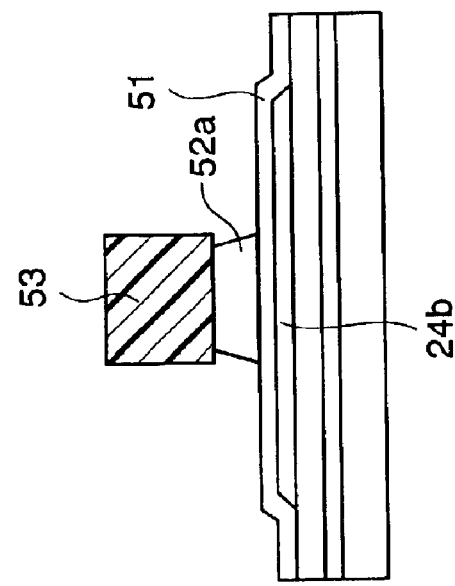
Figure 12B:
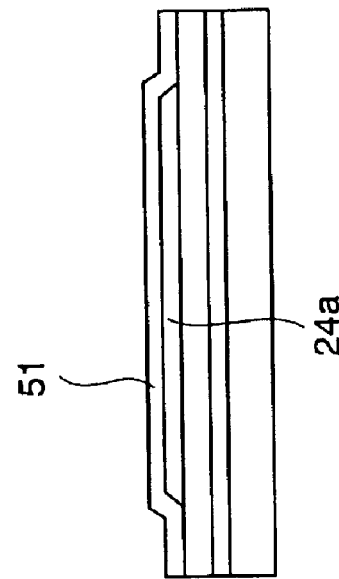

Then, the photoresist film is formed on the silicon oxide film 52 by the coating method. Then, as shown in FIG. 12B, a resist mask 53 is formed in the pixel TFT forming region via the exposing and developing steps.

Then, the silicon oxide film 52 is wet-etched by the dilute hydrofluoric acid based on the resist mask 53. At this time, the amorphous silicon film 51, which has the etching resistance against the dilute hydrofluoric acid and is formed under the silicon oxide film 52, is used as the etching stopper. Thus, the silicon oxide film pattern (insulating film pattern) 52a is formed under the resist mask 53. Then, the resist mask 53 is removed.

Figure 12C:
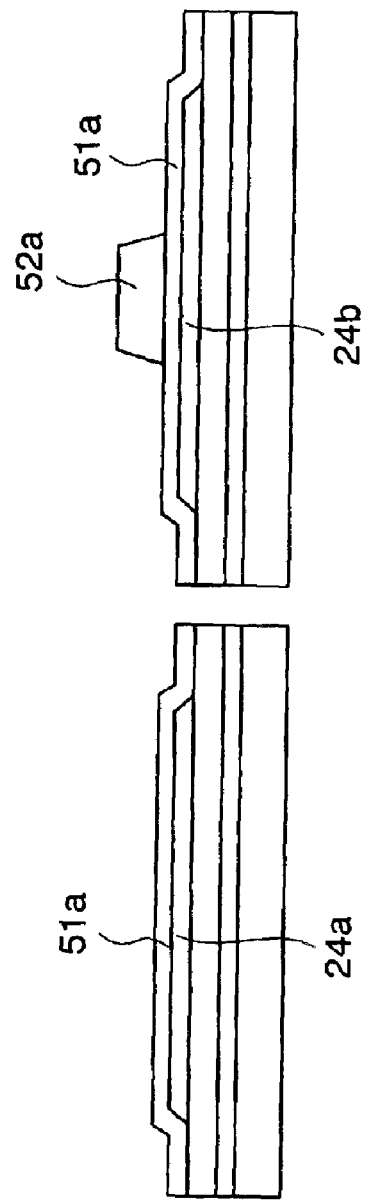

Then, as shown in FIG. 12C, the silicon oxide film (the insulating film formed by oxidizing the semiconductor film) 51a is formed by oxidizing the overall amorphous silicon film 51 containing the portion under the silicon oxide film pattern 52a by the high-pressure oxidation method. The high pressure oxidation is carried out in the steam atmosphere whose pressure is adjusted to 2 MPa, for example, at the temperature of 550° C. for one hour of the oxidation time. In this case, various methods such as the well-known thermal oxidation method, the plasma oxidation method, etc. may be employed in place of the high-pressure oxidation method.

Accordingly, the first gate insulating film made of the silicon oxide film 51a is formed on the first island-like semiconductor film 24a. Also, the second gate insulating film consisting of the silicon oxide film 51a and the silicon oxide film pattern 52a is formed on the second island-like semiconductor film 24b.

Figure 12D:
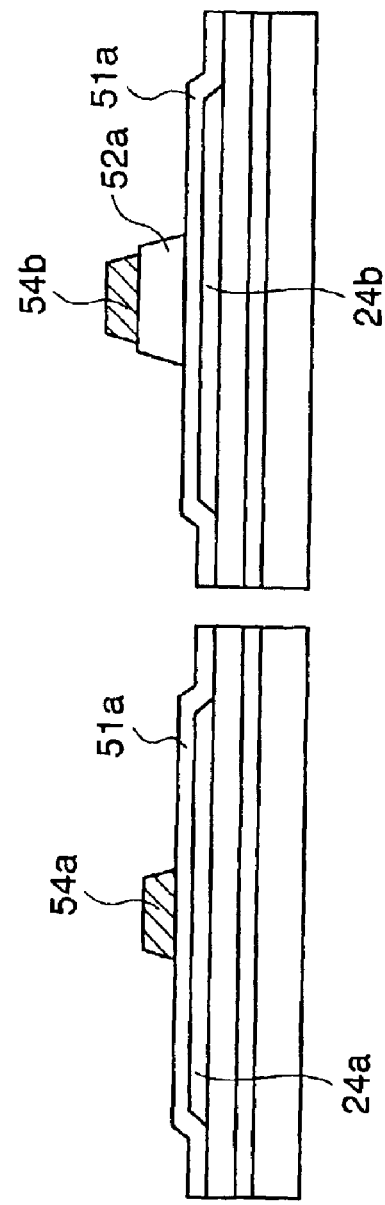

Then, as shown in FIG. 12D, the Al—Nd film of 300 nm thickness is formed by the sputter method. Then, the Al—Nd film is etched based on the resist mask (not shown). Thus, the first gate electrode 54a is formed on the first gate insulating film 51a in the low-voltage driving TFT forming region, while the second gate electrode 54b is formed on the second gate insulating film 51a and 52a in the pixel TFT forming region. At this time, the second gate electrode 54b is formed in an area that is smaller than an upper surface of the second gate insulating film 52a and is positioned on the inner side than the periphery of the upper surface of the second gate insulating film 52a. Then, the resist mask is removed.

Then, as shown in FIG. 12E, the high-concentration phosphorous is ion-implanted into the first island-like semiconductor film 24a by using the first gate electrode 54a as a mask. At the same time, the high-concentration phosphorous is ion-implanted into the second island-like semiconductor film 24b by using the second gate electrode 54b and the second gate insulating film 51a and 52a as a mask. At this time, as the ion implantation conditions, for example, the acceleration voltage is set to 25 keV and the dosage is set to $7 \times 10^{14}$ cm$^{-2}$. Thus, the n-type high-concentration impurity regions 24aa, 24ab are formed in the first island-like semiconductor film 24a on both sides of the first gate electrode 54a. Also, the n-type high-concentration impurity regions 24ba, 24bb are formed in the second island-like semiconductor film 24b on both sides of the second gate insulating film 51a and 52a.

Then, the low-concentration phosphorous is ion-implanted into the second island-like semiconductor film 24b under the conditions which do not allow the P ion to transmit through the first and second gate electrodes but allow the P ion to transmit through the first and second island-like semiconductor films 24a, 24b and also the second gate insulating film 51a and 52a. As the ion implantation conditions, for example, the acceleration voltage is set to 70 keV and the dosage is set low such as $2 \times 10^{13}$ cm$^{-2}$. Thus, the n-type low-concentration impurity regions (the LDD regions) 24bc, 24bd are formed in the second island-like semiconductor film 24b between the edges of the second gate electrode 54b and the edges of the high-concentration impurity regions 24ba, 24bb.

Then, as shown in FIG. 12F, the silicon nitride film 55 of 370 nm thickness is formed on the overall surface of the glass substrate 21 by the plasma CVD method.

Then, as shown in FIG. 12G, the contact holes 56a, 56b, which pass through the silicon nitride film 55 on the high-concentration impurity regions 24aa, 24ab in the first island-like semiconductor film 24a, by dry-etching the silicon nitride film (first interlayer insulating film) 55 based on the resist mask (not shown) while using a SF$_6$ gas. At the same time, the contact holes 56c, 56d, which pass through the silicon nitride film 55 on the high-concentration impurity regions 24ba, 24bb in the second island-like semiconductor film 24b. Then, the resist mask is removed.

Then, as shown in FIG. 12H, the Ti film of 50 nm thickness, the Al film of 100 nm thickness, and the Ti film of 50 nm thickness are deposited sequentially on the overall surface on the upper side of the glass substrate 21 by the sputter method. Thus, these metal films are buried in the contact holes 56a, 56b, 56c, 56d and also the metal laminated film formed of these metal films is formed on the silicon nitride film 55. Then, a resist mask (not shown) is formed by the photolithography. Then, the metal laminated film is dry-etched based on this resist mask. Thus, this step results in a formation of the source/drain electrodes 57a, 57b that come into contact with the high-concentration impurity regions (the source/drain regions) 24aa, 24ab of the low-voltage driving TFT. At the same time, it results in a formation of the source/drain electrodes 57c, 57d that come into contact with the high-concentration impurity regions (the source/drain regions) 24ba, 24bb of the pixel TFT.

In this case, the data bus lines 108 are formed in the display portion 104 simultaneously with the formation of the source/drain regions 57a to 57d. Also, the predetermined wiring pattern is formed in the area in which the control circuit 101, the data driver 102, and the gate driver 103.

Then, the resin film (second interlayer insulating film) 58 of 3.0 μm thickness is formed by coating the photosensitive resin. As described above, the thin film transistor device is completed. Subsequently, following steps are executed to manufacture the liquid crystal display device.

Then, the via hole is formed in the resin film 58 on the source/drain electrode 57d. Then, the ITO (Indium-Tin Oxide) film of 70 nm thickness is formed on the overall surface on the upper side of the glass substrate 21 by the sputter method. Then, a pixel electrode 60 that comes into contact with the source-side impurity region of the pixel TFT is formed by patterning the ITO film by the normal photolithography step. Then, the alignment film (not shown) that decides the alignment direction of the liquid crystal molecule in the initial state (at the time of no voltage application) is formed on the overall surface on the upper side of the glass substrate 21.

In this fashion, the TFT substrate of the liquid crystal display device is completed.

The opposing substrate of the liquid crystal display device is formed by the well-known method. More particularly, the black matrix that shields the areas between the pixels from the light is formed by Cr (chromium), for example, on the glass substrate. Also, the color filters of the red color, the green color, and the blue color are formed on the glass substrate such that the color filter having any one color of the red color, the green color, and the blue color is arranged every pixel. Then, the transparent electrode made of the ITO film is formed on the overall surface on the upper side of the glass substrate, and the alignment film is formed on the transparent electrode.

The liquid crystal display panel is constructed by pasting together the TFT substrate and the opposing substrate, which are manufactured in this manner, and then introducing the liquid crystal into a space between them and sealing an introduction portion. Then, the liquid crystal display device is completed by arranging the polarization plate on both surfaces of this liquid crystal display panel and arranging the backlight on the back surface side.

As described above, according to the second embodiment, as shown in FIG. 12B, when the insulating film serving as a part of the second gate insulating film is formed by etching the silicon oxide film, the first island-like semiconductor film 24a is protected by the underlying amorphous film 51. Therefore, the channel region of the first island-like semiconductor film 24a is not exposed to the plasma of the etching gas of the silicon oxide film 52. Therefore, the deterioration of the TFT characteristic of the thin thickness portion on behalf of the low-voltage driving TFT can be prevented, and thus both the TFT in the thick thickness portion on behalf of the pixel TFT and the TFT in the thin thickness portion can assure the good characteristics.

Also, the silicon oxide film 22b under the first and second island-like semiconductor films 24a, 24b is also protected by the amorphous silicon film 51. Therefore, even if the silicon oxide film 22b is formed on the surface of the substrate, the "scraped portion" is not generated at edge portions of the first and second island-like semiconductor films 24a, 24b. While if not protected, the "scraped portion" is caused at the edge portions by etching the silicon oxide film 22b on the surface of the substrate 21.

In addition, when the insulating film serving as a part of the second gate insulating film is formed by etching the silicon oxide film 52, the amorphous silicon film 51 has the etching resistance against the etchant of the silicon oxide film 52 and thus the reduction in film thickness is not generated. In this embodiment, since the first gate insulating film 51a is formed by oxidizing the amorphous silicon film 51, the film thickness of the first gate insulating film 51a can be controlled easily with good precision.

In the above embodiment, the amorphous silicon film 51 is formed directly on the first and second island-like semiconductor films 24a, 24b. The silicon oxide film for covering the first and second island-like semiconductor films 24a, 24b may be formed and then the amorphous silicon film 51 and the silicon oxide film 52 may be formed thereon. Accordingly, in addition to the above effect, control of the film thickness of the first gate insulating film can be further facilitated when the first gate insulating film is formed by oxidizing the amorphous silicon film 51. In this case, the film thickness of the first gate insulating film is constructed by the silicon oxide film, which covers the first island-like semiconductor film 24a, and the silicon oxide film 51a, which is formed by oxidizing the amorphous silicon film 51. Also, the second gate insulating film is constructed by the silicon oxide film, which covers the second island-like semiconductor film 24b, and the silicon oxide film 51a, which is formed by oxidizing the amorphous silicon film 51, and the silicon oxide film 52a.

(Another Thin Film Transistor Device Manufacturing Method)

FIGS. 13A to 13D are sectional views showing another thin film transistor device manufacturing method according to the second embodiment of the present invention.

Figure 13A:
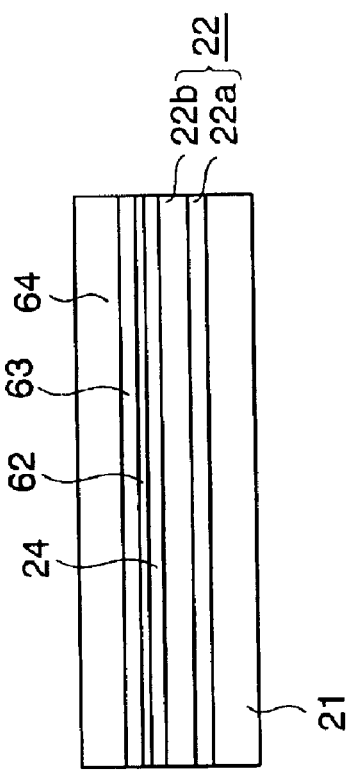
FIGS. 13A to 13D are sectional views showing another thin film transistor device manufacturing method according to the second embodiment of the present invention.
Figure 13A:
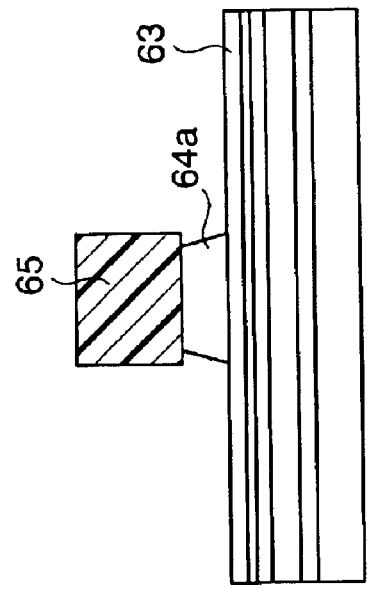

First, as shown in FIG. 13A, like the first embodiment, the silicon nitride film 22a of 50 nm thickness, the silicon oxide film 22b of 200 nm thickness, and the amorphous silicon film of 40 nm thickness are formed on the glass substrate 21. Then, the amorphous silicon film is changed into the polysilicon film (first semiconductor film) 24 by irradiating the excimer laser onto the amorphous silicon film.

Then, a first silicon oxide film (first insulating film) 62 of 10 nm thickness, an amorphous silicon film (second semiconductor film) 63 of 10 nm thickness, and a second silicon oxide film (second insulating film) 64 of 100 nm thickness are formed by the plasma CVD method.

Figure 13B:
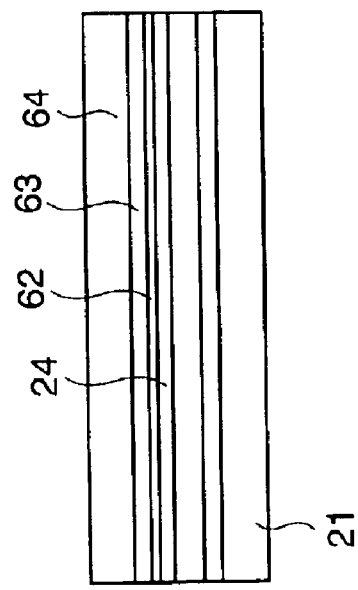
Figure 13B:
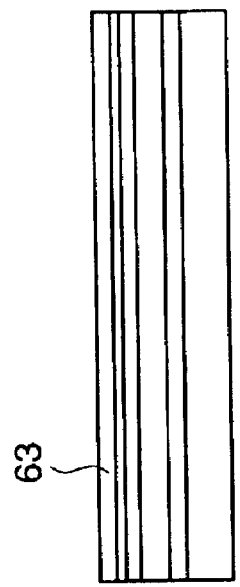

Then, as shown in FIG. 13B, a resist mask 65 is formed in the pixel TFT forming region. Then, the second silicon oxide film pattern (the second insulating film pattern) 64a is formed by etching the silicon oxide film 64 based on the resist mask 65 while using the dilute hydrofluoric acid. Then, the resist mask 65 is removed.

Figure 13C:
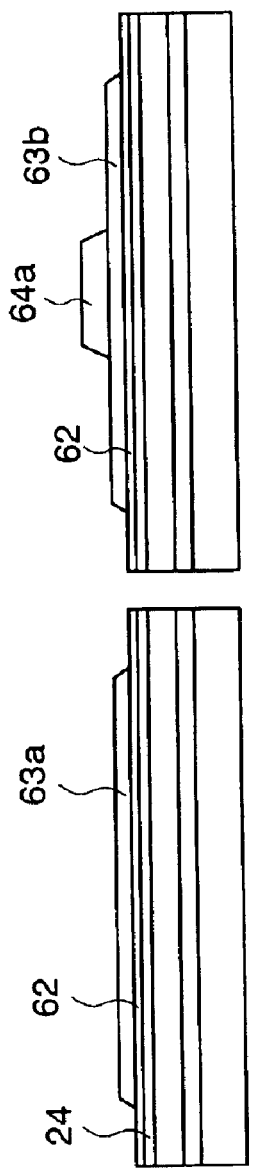

Then, as shown in FIG. 13C, a new resist mask (not shown) is formed. Then, the amorphous silicon film 63 is dry-etched by using the etching gas containing the fluorine based on the new resist mask. Thus, it results in a formation of a first island-like amorphous silicon film (a second island-like semiconductor film not-containing the second insulating film pattern) 63a and a second island-like amorphous silicon film (a second island-like semiconductor film containing the second insulating film pattern) 63b. Then, the resist mask is removed.

Figure 13D:
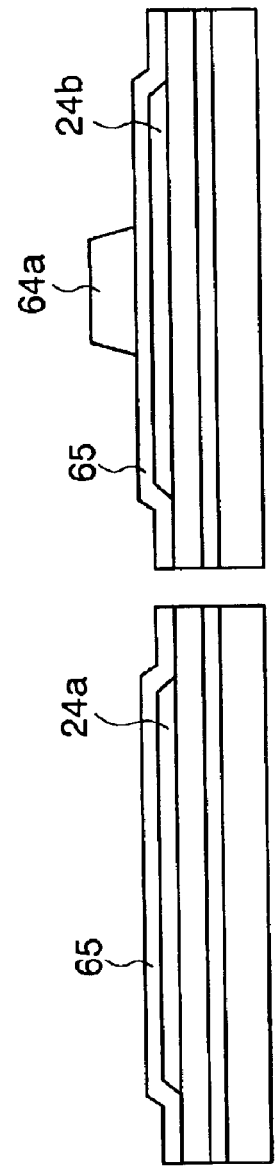

Then, the first island-like amorphous silicon film 63a and the second island-like amorphous silicon film 63b under the second silicon oxide film pattern 64a and other portions are oxidized by the high-pressure oxidation method, for example. At the same time, the polysilicon film 24 in the region, which is not covered with the first island-like amorphous silicon film 63a, and the polysilicon film 24 in the region, which is not covered with the second island-like amorphous silicon film 63b, are oxidized via the first silicon oxide film 62. Accordingly, as shown in FIG. 13D, the first island-like semiconductor film 24a made of the polysilicon film is formed in the region that is covered with the first island-like amorphous silicon film 63a. At the same time, the second island-like semiconductor film 24b made of the polysilicon film is formed in the region that is covered with the second island-like amorphous silicon film 63b. In other words, the first island-like semiconductor film 24a is provided thereon with the first gate insulating film 65 made of the first silicon oxide film 62 and the insulating film, which is formed by oxidizing the first island-like amorphous silicon film 63a. At the same time, the second island-like semiconductor film 24b ia provided thereon with the second gate insulating film consisting of the insulating film 65, which is made of the first silicon oxide film 62 and the insulating film that is formed by oxidizing the second island-like amorphous silicon film 63b, and the second silicon oxide film pattern 64a.

Subsequently, the thin film transistor device is formed via the similar steps to those shown in FIG. 12D to FIG. 12F. Then, the liquid crystal display device is fabricated via the normal steps in the liquid crystal display device manufacturing method explained in the first and second embodiments.

As described above, according to another thin film transistor device manufacturing method as the second embodiment, as shown in FIG. 13B, when the insulating film 64a serving as a part of the second gate insulating film is formed by etching the silicon oxide film 64, the first island-like semiconductor film 24a is protected by the underlying amorphous silicon film 63. Thus, the channel region of the first island-like semiconductor film 24a is not exposed to the plasma of the etching gas of the silicon oxide film 64. Therefore, the deterioration of the TFT characteristic in the thin thickness portion can be prevented and thus both the TFT in the thick thickness portion and the TFT in the thin thickness portion can assure the good characteristics.

Also, as shown in FIG. 13D, the silicon oxide film 64 on the amorphous silicon film 63, which acts as the thick thickness portion of the second gate insulating film, is etched. Then, the first and second island-like semiconductor films 24a, 24b are formed by oxidizing selectively the polysilicon film 24 under the amorphous silicon film 63. In this manner, the underlying silicon oxide film 22b is not exposed to the etching gas, etc. Therefore, the "scraped portion" caused by etching the underlying silicon oxide film 22b is not generated at the edge portions of the first and second island-like semiconductor films 24a, 24b.

In addition, when the insulating film serving as a part of the second gate insulating film is formed by etching the silicon oxide film 64, the amorphous silicon film 63 has the etching resistance against the etchant of the silicon oxide film 64 and thus the reduction in film thickness is not generated in the amorphous silicon film 63. In this embodiment, since the first gate insulating film is formed of the insulating film 63a from the oxidation of the amorphous silicon film 63 and the first silicon oxide film 62, the film thickness of the first gate insulating film can be controlled easily with good precision.

Third Embodiment

Next, a structure of a thin film transistor device manufacturing method according to a third embodiment of the present invention will be explained with reference to the drawings hereunder.

In the thin film transistor device according to the third embodiment, the TFT consisting of at least any one of the n-type TFT and the p-type TFT having the thin gate insulating film (referred to as the TFT in the thin thickness portion) and the TFT consisting of at least any one of the n-type TFT and the p-type TFT having the thick gate insulating film (referred to as the TFT in the thick thickness portion) are mounted on the same substrate. Structures of the n-type TFT in the thin thickness portion and the n-type TFT in the thick thickness portion will be explained hereunder.

Figure 14A:
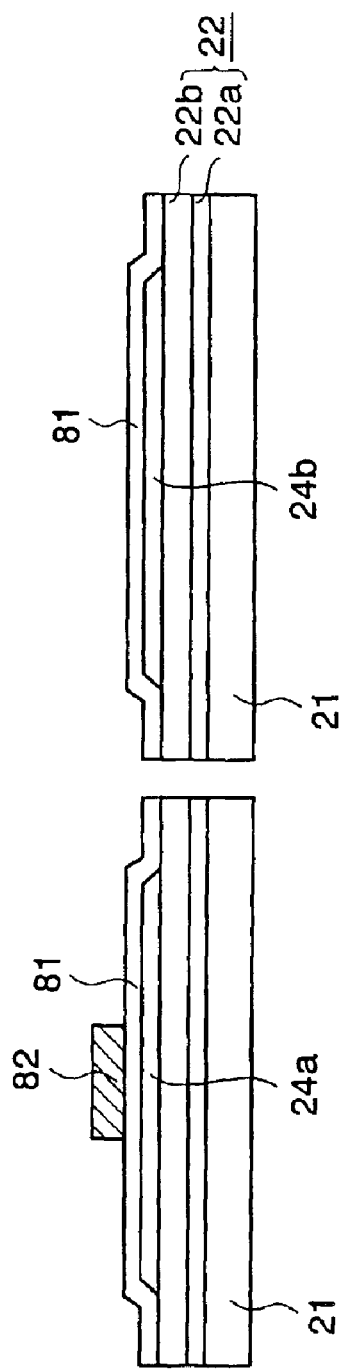
FIGS. 14A to 14F are sectional views showing a thin film transistor device manufacturing method according to a third embodiment of the present invention.
Figure 14B:
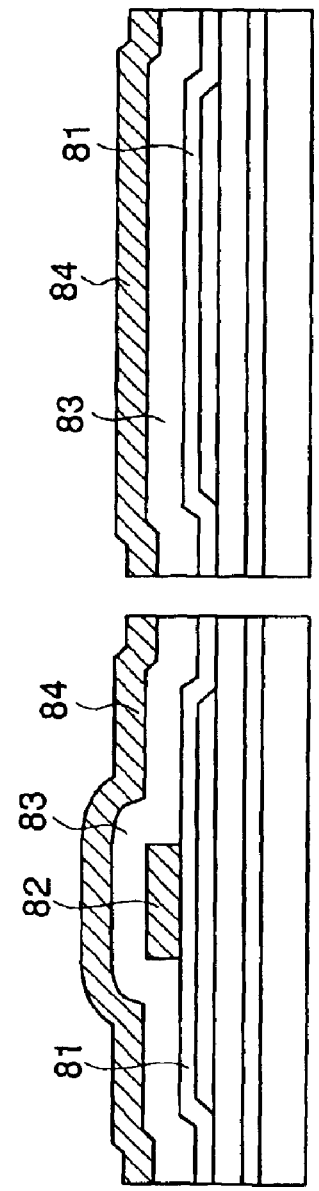
Figure 14C:
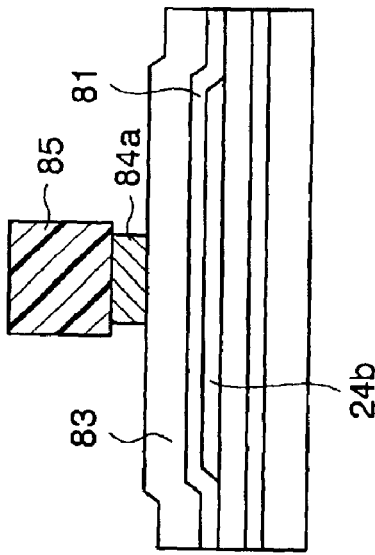
Figure 14C:
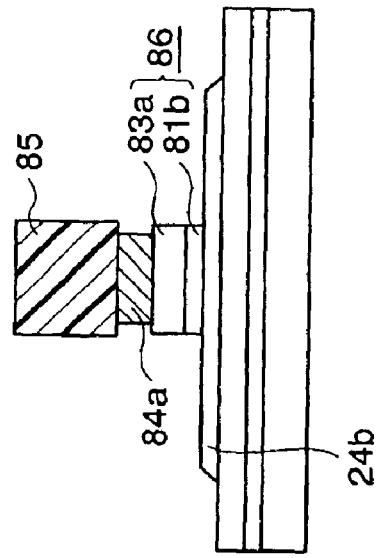
Figure 14D:
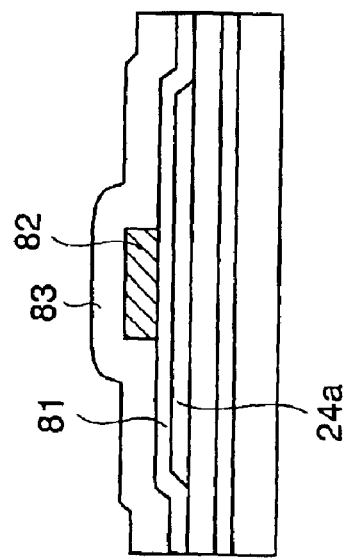
Figure 14D:
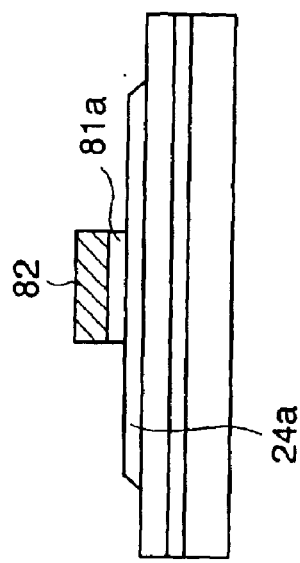
Figure 14E:
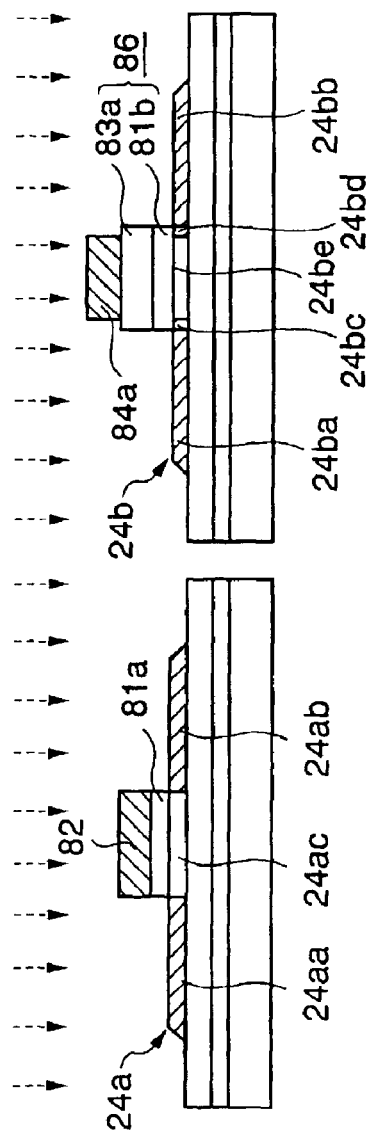
Figure 14F:
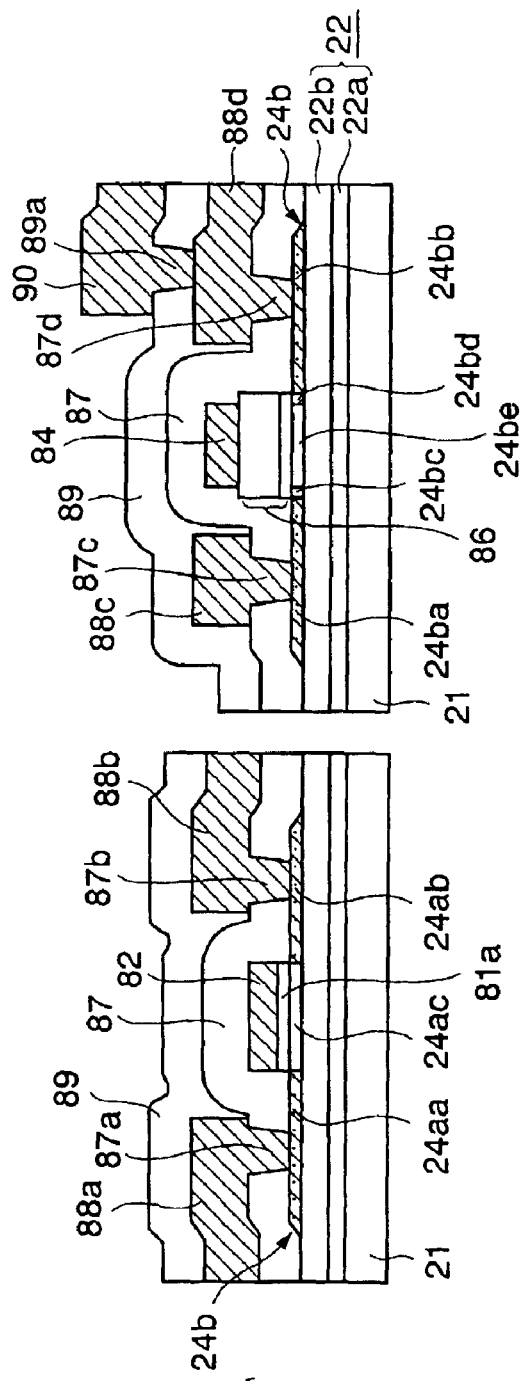
Figure 16A:
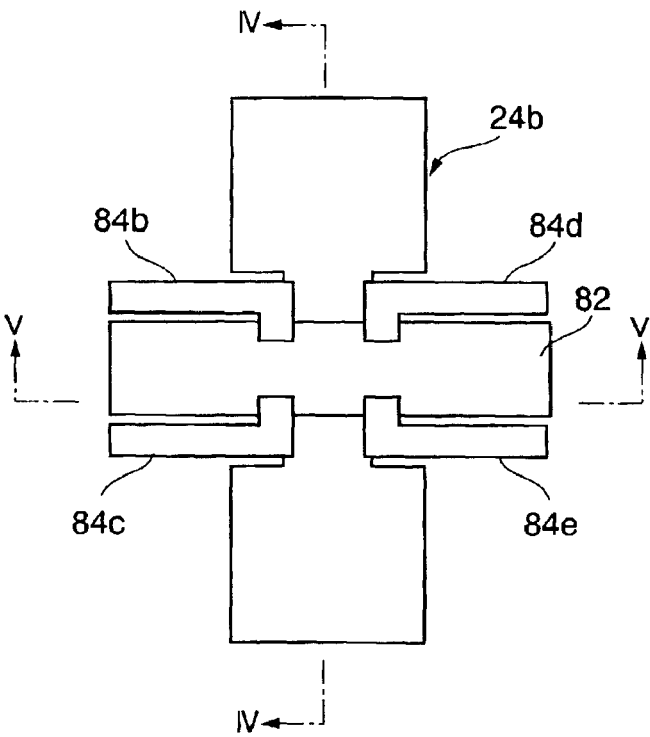
FIG. 16A is a plan view showing a thin film transistor device according to the third embodiment of the present invention.

FIG. 16A is a plan view showing the TFT in the thin thickness portion when viewed from the upper side, and a left-side view of FIG. 14F is a sectional view taken along a IV—IV line of FIG. 16A. Also, FIG. 16B is a sectional view taken along a V—V line of FIG. 16A.

The TFT in the thin thickness portion (the first thin film transistor) has constituent elements shown in the left-side views of FIGS. 16A and 14F. More particularly, the TFT in the thin thickness portion has the first island-like semiconductor film 24a made of the polysilicon film having a thickness of about 50 nm, a first gate insulating film 81a made of the first silicon oxide film (first insulating film) having a thickness of 30 nm, and a first gate electrode 82 made of a first Al—Nd (first conductive film) having a thickness of 30 nm. A pair of n-type source/drain regions 24aa, 24ab are formed in the first island-like semiconductor film 24a to put the channel region 24ac therebetween. A first gate insulating film 81*a* and a first gate electrode 82 are formed sequentially on the channel region 24*ac* in the first island-like semiconductor film 24*a*.

Also, the TFT in the thin thickness portion has a first interlayer insulating film 87 made of the silicon nitride film having a thickness of 400 nm, contact holes 87*a*, 87*b* formed in the first interlayer insulating film 87, source/drain electrodes 88*a*, 88*b* made of a metal film having a triple-layered structure consisting of Ti film (200 nm)/Al film (200 nm)/Ti film (200 nm), and a second interlayer insulating film 89 made of the silicon nitride film having a thickness of 400 nm. The first interlayer insulating film 87 covers the first island-like semiconductor film 24*a* and the first gate electrode 82. The source/drain electrodes 88*a*, 88*b* are connected to the source/drain regions 24*aa*, 24*ab*, which are formed in the first island-like semiconductor film 24*a*, via the contact holes 87*a*, 87*b* respectively. The second interlayer insulating film 89 covers the source/drain electrodes 88*a*, 88*b*.

Figure 16B:
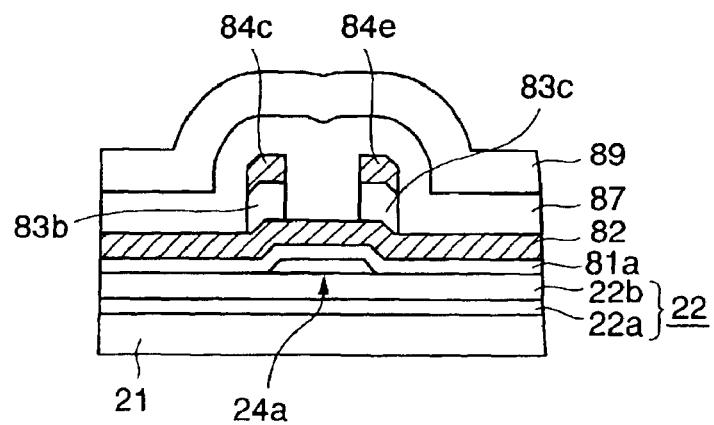
FIG. 16B is a sectional view taken along a V—V line of FIG. 16A.

In addition, as shown in FIGS. 16A and 16B, the TFT in the thin thickness portion is provided with electric-field relaxation electrodes 84*c* to 84*f*, which is made of a second Al—Nd film (second conductive film) having a thickness of 300 nm, via a second silicon oxide film (second insulating film) 83*b* on the first gate electrode 82 and over the edges at both sides of the first island-like semiconductor film 24*a*.

Figure 17A:
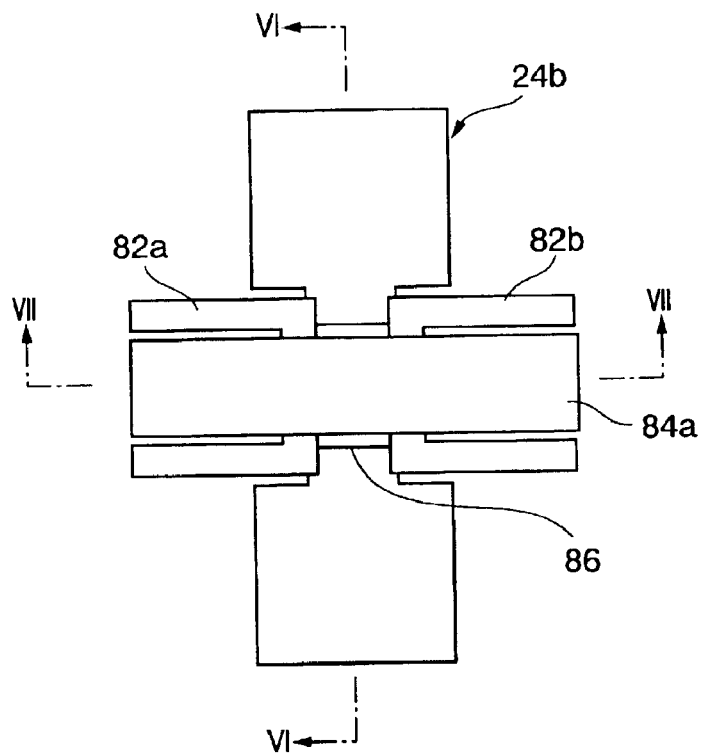
FIG. 17A is a plan view showing another thin film transistor device according to the third embodiment of the present invention.

Next, the TFT in the thick thickness portion will be explained hereunder. FIG. 17A is a plan view showing the TFT in the thick thickness portion when viewed from the upper side, and a right-side view of FIG. 14F is a sectional view taken along a VI—VI line of FIG. 17A. Also, FIG. 17B is a sectional view taken along a VII—VII line of FIG. 17A.

The TFT in the thick thickness portion (the second thin film transistor) has constituent elements shown in the right-side views of FIGS. 17A and 14F. More particularly, the TFT in the thick thickness portion has the second island-like semiconductor film 24*b* made of the polysilicon film having a thickness of about 50 nm, a second gate insulating film that consists of the first silicon oxide film 81*a* having the thickness of 30 nm and a second silicon oxide film 83*b* having a thickness of 70 nm, and a second gate electrode 84*a* made of a second Al—Nd (second conductive film) having a thickness of 300 nm. A pair of n-type source/drain regions 24*ba*, 24*bb* are formed in the second island-like semiconductor film 24*b* to put the channel region 24*be* therebetween. A second gate insulating film and a second gate electrode 84*a* are formed sequentially on the channel region 24*be*.

In addition, the TFT in the thick thickness portion (the second thin film transistor) has the silicon nitride film (first interlayer insulating film) 87, source/drain electrodes 88*c*, 88*d*, and a silicon oxide film (second interlayer insulating film) 89 that covers the source/drain electrodes 88*c*, 88*d*. The silicon nitride film 87 covers the second island-like semiconductor film 24*b* and the second gate electrode 84*a*. The source/drain electrodes 88*c*, 88*d* are connected to the source/drain regions 24*ba*, 24*bb*, which are formed in the second island-like semiconductor film 24*b*, via contact holes 87*c*, 87*d*, which are formed in the silicon nitride film 87, respectively.

Figure 17B:
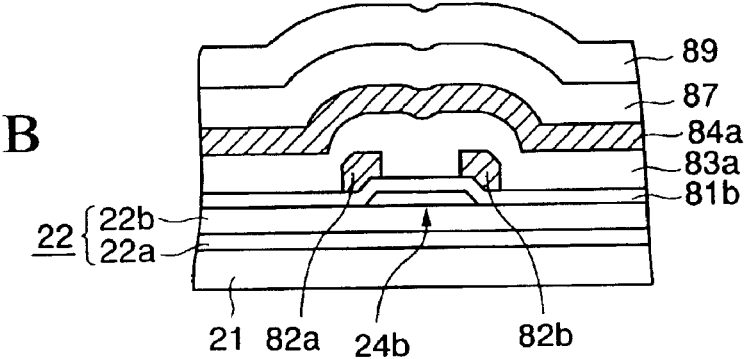
FIG. 17B is a sectional view taken along a VII—VII line of FIG. 17A.

In addition, as shown in FIGS. 17A and 17B, the TFT in the thick thickness portion has electric-field relaxation electrodes 82*b*, 82*c*, which is made of a first Al—Nd film, under the second gate electrode 84*a* via a first silicon oxide film 81*b* and over the edges at both sides of the second island-like semiconductor film 24*b*.

As described above, according to the thin film transistor device of the third embodiment of the present invention, in the TFT in the thin thickness portion, the electric-field relaxation electrodes 84*c* to 84*f* are provided on the first gate electrode 82 via the second silicon oxide film 83*b* and over the edges at both sides of the first island-like semiconductor film 24*a*. Thus, the parasitic capacitance at this portion becomes larger by the electrostatic capacitance, which is formed by the first gate electrode 82 and the electric-field relaxation electrodes 84*c* to 84*f* in comparison with the capacitance, which is formed by the first island-like semiconductor film 24*a*, the first silicon oxide film 81*a*, and the first gate electrode 82. Therefore, if the gate of the TFT is driven by the alternative current, the change in the gate potential that is applied to the edge portions at both sides of the first island-like semiconductor film 24*a* becomes slow. As a result, operations of the parasitic transistors, which are formed at the edge portions of the first island-like semiconductor film 24*a* on both sides, can be suppressed.

Also, in the TFT in the thick thickness portion, the electric-field relaxation electrodes 82*b*, 82*c* are provided under the second gate electrode 84*a* via the first silicon oxide film 81*b* and over the edges at both sides of the second island-like semiconductor film 24*b*. According to this structure, potentials of the electric-field relaxation electrodes 82*b*, 82*c* are set to the potential at which the channels of the edge portions at both sides of the second island-like semiconductor film 24*b* do not become conductive. It results in a suppression of the conduction of the channels of the edge portions at both sides of the second island-like semiconductor film 24*b*. Also, the turning-ON of the parasitic transistors can be suppressed by shielding the influence of the electric field from the second gate electrode 84*a*.

Next, a thin film transistor device manufacturing method according to the third embodiment will be explained with reference to FIGS. 14A to 14F hereunder.

First, as shown in FIG. 14A, the substrate is formed by laminating sequentially the silicon nitride film 22*a* of 50 nm thickness and the silicon oxide film 22*b* of 250 nm thickness on the glass substrate 21. In this case, if the case may be, the silicon nitride film 22*a* may be omitted.

Then, the amorphous silicon film of 50 nm thickness is formed on the substrate. Then, the dehydrogenation is carried out by executing the annealing at the temperature of 400° C. Then, the amorphous silicon film is annealed by using the excimer laser at the energy of 300 mJ/cm$^2$ and thus changed into the polysilicon film. Then, the first and second island-like semiconductor films 24*a*, 24*b* are formed by patterning the polysilicon film.

Then, the first silicon oxide film (first insulating film) 81 for covering the first and second island-like semiconductor films 24*a*, 24*b* and having a thickness of 30 nm is formed by the CVD method. Then, the first Al—Nd film (first conductive film) of 300 nm thickness is formed on the overall surface by the PVD method. Then, the first gate electrode 82 is formed on the first silicon oxide film over the first island-like semiconductor film 24*a* by selectively etching the first Al—Nd film using the solution containing the phosphoric acid and the acetic acid based on the resist mask (not shown).

At this time, the electric-field relaxation electrodes 82*b*, 82*c* made of the first Al—Nd film, shown in FIGS. 17A and 17B, are formed in the range, which intersects with the second gate electrode 84*a* of the TFT in the thick thickness portion, over the edges at both sides of the second island-like semiconductor film 24*b* and via the first silicon oxide film 81.

Then, the TFT forming region in the thin thickness portion is covered with the resist mask (not shown). Then, the silicon oxide film is slightly etched by the solution containing the hydrofluoric acid. Then, the resist mask is removed. Here, if the silicon nitride film is selected as the material of the gate insulating film 81 of the TFT in the thin thickness portion and also the chromium (Cr) is selected as the material of the first gate electrode 82, these materials have the etching resistance against the solution containing the hydrofluoric acid. Therefore, there is no necessity that the TFT forming region in the thin thickness portion should be covered with the resist mask.

Then, as shown in FIG. 14B, the second silicon oxide film (second insulating film) 83 of 70 nm thickness is formed on the overall surface by the CVD method. Then, the second Al—Nd film (second conductive film) 84 of 300 nm thickness is formed by the PVD method.

Then, as shown in FIG. 14C, the resist mask (mask pattern) 85 is formed on the second Al—Nd film 84. Then, the second Al—Nd film 84 in the range not covered with the resist mask 85 is removed by wet-etching the second Al—Nd film 84 based on the resist mask 85 while using the solution containing the phosphoric acid and the acetic acid. Then, the second gate electrode 84a whose width is set narrower than the resist mask 85 by the LDD region on one side is formed by applying the side-etching to the second Al—Nd film 84 under the resist mask 85.

At this time, the electric-field relaxation electrodes 84c to 84f made of the second Al—Nd film, shown in FIGS. 16A and 16B, are formed on the first gate electrode 24a via the second silicon oxide film 83b, 83c and over the edges of the first island-like semiconductor film 24a on both sides.

Then, as shown in FIG. 14D, the second silicon oxide film 83 is anisotropic-etched based on the same resist mask 85 by using the etching gas containing $CHF_3$. Then, the first silicon oxide film 81 is anisotropic-etched based on the first gate electrode 82 and the resist mask 85. Thus, the first insulating film made of the first silicon oxide film 81a is formed under the first gate electrode 82. At the same time, the second gate insulating film 86 made of the first and second silicon oxide films 81b, 83a is formed under the second gate electrode 84a.

Figure 15:
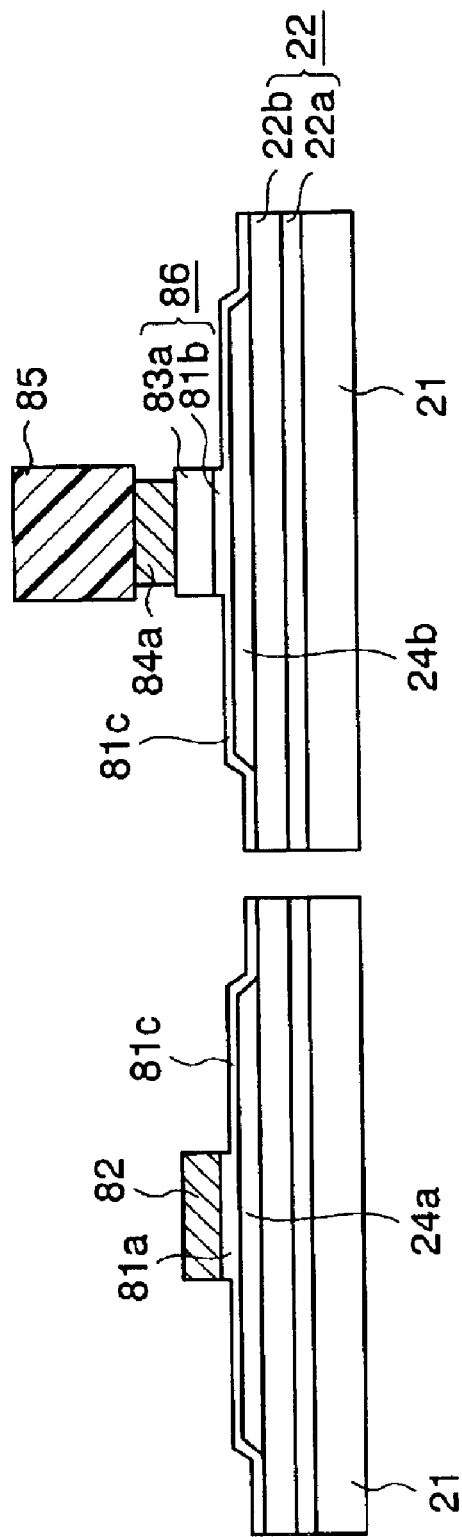
FIG. 15 is a sectional view showing another thin film transistor device manufacturing method according to the third embodiment of the present invention.

In this case, as shown in FIG. 15, the first silicon oxide film 81c may be left in thickness of about 10 nm on the first and second island-like semiconductor films 24a, 24b and other regions. Then, the resist mask 85 is removed.

Then, as shown in FIG. 14E, the phosphorus (impurity) is ion-implanted into the first island-like semiconductor film 24a with a high concentration by using the first gate electrode 82 as a mask. Thus, the high-concentration impurity regions 24aa, 24ab are formed on both sides of the first gate electrode 82. At the same time, the phosphorus (impurity) is ion-implanted into the second island-like semiconductor film 24b with a high concentration by using the second gate electrode 84a and the second gate insulating film 83a, 81b as a mask. Thus, a pair of high-concentration impurity regions 24ba, 24bb are formed on both sides of the second gate electrode 84a. At this time, as the ion implantation conditions, the acceleration voltage is set to 10 keV and the dosage is set to $1\times10^{15}/cm^2$.

Then, the phosphorous (impurity) is ion-implanted into the second island-like semiconductor film 24b by using the second gate electrode 84a as a mask under the conditions that the P ion can transmit through the second gate insulating film 83a, 81b in the peripheral portion of the second gate electrode 84a. Thus, a pair of low-concentration impurity regions 24bc, 24bd as the LDD regions are formed under the second gate insulating film 83a, 81b on both sides of the second gate electrode 84a. At this time, as the ion-implantation conditions, for example, the acceleration voltage is set to 100 keV, and the dosage is set to $1\times10^{14}/cm^{-2}$.

In this case, if the p-channel type TFT is mixed, the boron is ion-implanted with high concentration at the acceleration voltage of 10 keV and the dosage of $1\times10^{16}/cm^{-2}$, for example, before and after the phosphorus is ion-implanted without covering the operating layer of the p-channel type TFT with a mask. Thus, since the phosphorus concentration is compensated with the boron in the operating layer of the p-channel type TFT, the conductivity type of the operating layer of the p-channel type TFT becomes the p-type.

Then, the dehydrogenation of the first and second island-like semiconductor films 24a, 24b is carried out by executing the annealing at the temperature of 400° C. Then, the phosphorus in the first and second island-like semiconductor films 24a, 24b is activated by executing the annealing by the laser irradiation at the condition of $250 \text{ mJ/cm}^2$.

Then, as shown in FIG. 14F, a silicon nitride film (first interlayer insulating film) of 300 nm thickness is formed by the CVD method. Then, contact holes 87a, 87b are formed on the high-concentration impurity regions 24aa, 24ab in the TFT forming region of the thin thickness portion by patterning the first silicon nitride film 87. At the same time, contact holes 87c, 87d are formed on the high-concentration impurity regions 24ba, 24bb in the TFT forming region in the thick thickness portion.

Then, a metal film having a triple-layered structure consisting of a film/an Al film/a Ti film is formed by the PVD method to have a thickness of 200 nm. Then, source/drain electrodes 88a, 88b that come into contact with the high-concentration impurity regions 24aa, 24ab via the contact holes 87a, 87b respectively are formed by patterning the triple-layered metal film. At the same time, source/drain electrodes 88c, 88d that come into contact with the high-concentration impurity regions 24ba, 24bb via the contact holes 87c, 87d respectively are formed.

Then, a silicon nitride film (second interlayer insulating film) 89 for covering the source/drain electrodes 88a to 88d is formed by the CVD method to have a thickness of 400 nm. As a result, the thin film transistor device is completed.

In the case that the TFT substrate of the liquid crystal display device and the liquid crystal display device are manufactured, as shown in the right-side view of FIG. 14F, a via hole 89a is formed in the silicon nitride film 89 on the source/drain electrode 88d. Then, the ITO film is formed and then a pixel electrode 90 that comes into contact with the source/drain electrode 88d via the via hole 89a is formed by patterning the ITO film. Then, the steps are carried out in compliance with the manufacturing method explained in the first and second embodiments.

As described above, in the thin film transistor device manufacturing method according to the third embodiment of the present invention, as shown in FIG. 14C, the second gate electrode 84a whose width is small by the LDD region from the edge of the resist mask 85 on one side is formed by side-etching the Al—Nd film based on the resist mask 85. In addition, the second gate insulating film 86 whose width is larger than the second gate electrode 84a by the LDD region on one side is formed by anisotropic-etching the silicon oxide films 83, 81 based on the resist mask 85. Then, as shown in FIG. 14E, the ion implantation is carried out at the high dosage under the conditions that the ion cannot transmit through the second gate insulating film 86 during the ion implantation. In addition, the ion implantation is carried out at the low dosage under the conditions that the ion can transmit through the second gate insulating film 86. Accordingly, the LDD structures are formed in the second island-like semiconductor film 24*b*.

In this manner, the LDD structures can be formed in the self-alignment manner by utilizing the gate electrode 84*a* and the gate insulating film 86 not to increase the number of the exposure masks.

Also, as shown in FIGS. 14C and 14D, since the gate insulating films 81*a*, 86 having a different film thickness respectively can be formed at a time by one etching step, the simplification of the steps can be achieved. In this case, since the channel regions in the first and second island-like semiconductor films 24*a*, 24*b* are not exposed to the plasma of the etching gas mutually, generation of the damaged layer on the surfaces of the channel regions in the first and second island-like semiconductor films 24*a*, 24*b* can be prevented.

Fourth Embodiment

Next, a structure of a liquid crystal display device into which thin film transistor devices according to a fourth embodiment of the present invention are installed will be explained with reference to the drawings hereunder.

As has already been explained in the first embodiment, in the liquid crystal display device, the TFT in the thin thickness portion (the first thin film transistor) and the TFT in the thick thickness portion (the second thin film transistor) are formed on the same substrate. Also, the TFT in the thin thickness portion is employed in the peripheral circuit portion, and the TFT in the thick thickness portion is employed in the display portion. Also, the TFT that is similar to the TFT in the thick thickness portion is also employed in the buffer portion that handles the high voltage in the peripheral circuit portion.

Since this fourth embodiment has a feature in the structure of the display portion, particularly the structure of the storage capacitor element that is attached to the storage capacitor bus line, explanation of such structure will be made mainly hereunder.

Figure 18:
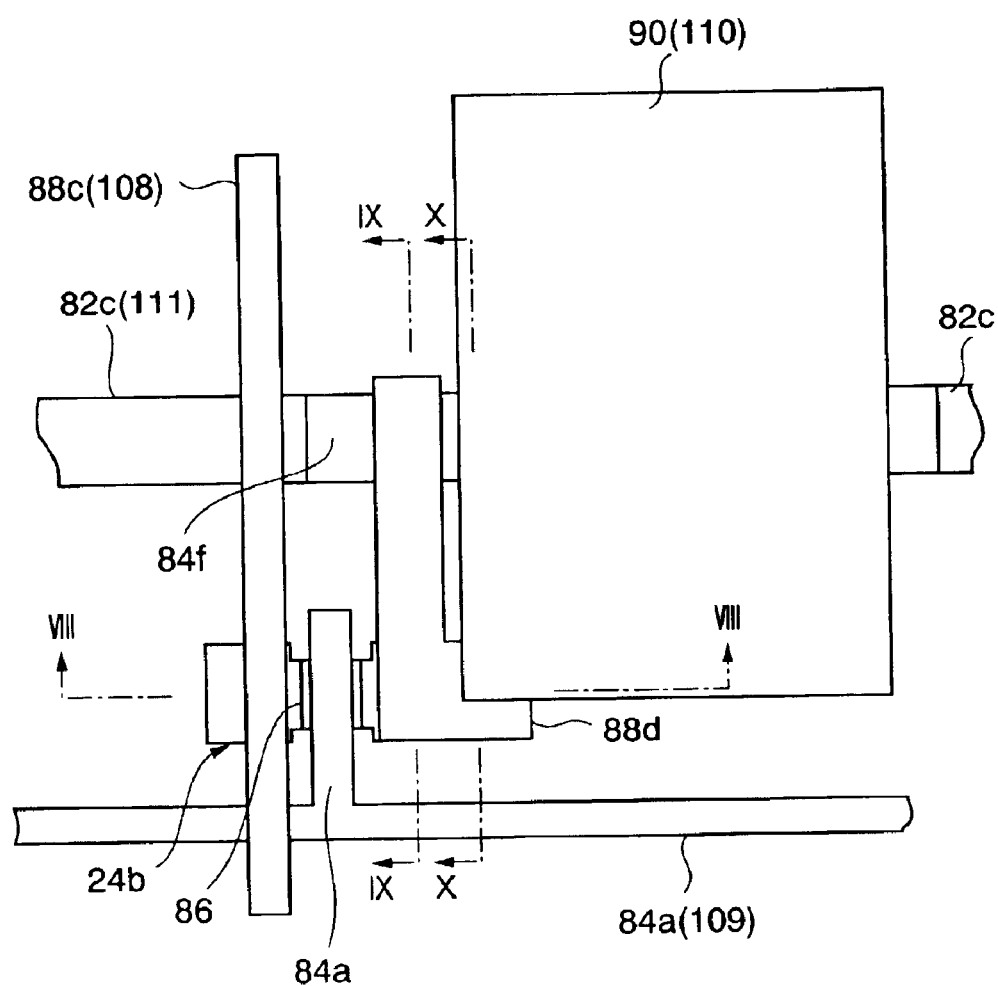
FIG. 18 is a plan view showing a liquid crystal display device having a thin film transistor device according to a fourth embodiment of the present invention.

FIG. 18 is a plan view showing a structure of one pixel in the display portion of liquid crystal display device according to a fourth embodiment of the present invention when viewed from the upper side. A sectional view taken along a VIII—VIII line in FIG. 18 shows a cross section of the TFT, and is shown in the right-side view of FIG. 14F. FIG. 19A are sectional views taken along a IX—IX line of FIG. 18 similarly, and FIG. 19B are sectional views taken along a X—X line of FIG. 18.

First, as shown in FIG. 18, a pixel electrode 110 (90) is connected to the source/drain region 24*bb* via the source/drain electrode 88*d* of the TFT in the thick thickness portion. Then, a storage capacitor bus line 111 (82*c*) is provided to intersect with the pixel electrode 90. The storage capacitor bus line 82*c* is formed by the same material as the first gate electrode 82 of the TFT in the thin thickness portion. This line is connected to the source/drain electrode 88*d* of the TFT in the thick thickness portion.

The data bus line 108 is formed by the same material as the source/drain electrode 88*c*. This line is connected to another source/drain electrode 24*ba* of the TFT in the thick thickness portion. Also, the gate bus line 109 is formed by the same material as the second gate electrode 84*a* of the TFT in the thick thickness portion. This line is connected to the second gate electrode 84*a*.

As shown in the right-side view of FIG. 14F, the TFT in the thick thickness portion comprises the second island-like semiconductor film 24*b*, the second gate insulating film 86 consisting of the first and second silicon oxide films 81*b*, 83*a*, and the second gate electrode 84*a* made of the second Al—Nd film. The second island-like semiconductor film 24*b* has a pair of source/drain regions 24*ba*, 24*bb* that are formed to put the channel region 24*be* therebetween, and any one of them is connected to the pixel electrode 90. The second gate insulating film 86 and the second gate electrode 84*a* are formed sequentially on the channel region 24*be*.

As shown in the right-side views of FIGS. 19A and 19B respectively, the storage capacitor bus line 82*c* is formed of the first Al—Nd film. The second silicon oxide film 83*d* and the second Al—Nd film 84*f* are laminated sequentially on the storage capacitor bus line 82*c* in its partial area. Also, as shown in FIG. 19A, the second Al—Nd film 84*f* is connected to the source/drain electrode 88*d* of the TFT in the thick thickness portion. Then, as shown in the left-side view of FIG. 19B, the second Al—Nd film 84*f* is connected to the pixel electrode 90 via the source/drain electrode 88*d*. In this case, the source/drain electrode 88*d* has a triple-layered structure consisting of a Ti film 88*da*/an Al film 88*db*/a Ti film 88*dc*. Since the elements denoted by the same symbols as those in FIG. 14F correspond to the same elements as those in FIG. 14F, their explanation will be omitted herein.

In this case, since the TFT in the thin thickness portion has the same structure as that in the left-side view of the FIG. 14F, its explanation will be omitted herein.

As described above, according to the liquid crystal display device of the fourth embodiment of the present invention, the storage capacitor bus line 108 in the display portion is formed by the same material as the first gate electrode 82 of the TFT in the thin thickness portion. Also, there is provided the capacitor element in which one electrode is formed by the storage capacitor bus line 108, the capacitor insulating film 83*d* is formed by the same material as the second insulating film 83*a* of the second gate insulating film 86, and the other electrode 84*f* is formed by the same material as the second gate electrode 84*a*.

Accordingly, since normally the gate insulating film can be formed thin, it results in the capacitor element having a higher capacitance per unit area than that of the capacitor element, which has the other electrode made of the ITO film and the capacitor insulating film made of the interlayer insulating film. As a result, since an area of the storage capacitor bus line 108 necessary for the formation of the storage capacitor, i.e., a light shielding area, can be reduced, the aperture ratio can be improved.

The thin film transistor device manufacturing method according to the third embodiment is applied to the formation of the thin film transistor device employed in this liquid crystal display device. In this case, the storage capacitor bus line 82*c*, etc. are formed by the steps, which are common to the steps of forming the gate electrode of the TFT, etc., as described in the following.

The storage capacitor bus line 82*c* is formed of the first Al—Nd film at the same time when the first gate electrode 82 is formed. Also, when the second silicon oxide film 83 is etched to form the second gate insulating film 86 of the TFT in the thick thickness portion, the second silicon oxide film 83*d* is left on the storage capacitor bus line 82*a*. The second Al—Nd film 84*f* on the second silicon oxide film 83*d* is formed by executing the patterning simultaneously with the formation of the second gate electrode 84*a*. Also, the gate bus line 109 is formed simultaneously with the formation of the gate electrode 84*a*, and the data bus line 108 is formed simultaneously with the formation of the source/drain electrodes 88*a* to 88*d*.

Then, the via hole 89a is formed on the source/drain electrode 88d by patterning the silicon nitride film 89 subsequently to the steps of forming the silicon nitride film 89 explained in the third embodiment. Then, the ITO film of 100 nm thickness is formed by the PVD method, and then the pixel electrode 90 is formed by patterning the ITO film.

Then, the alignment film (not shown) that decides the alignment direction of the liquid crystal molecule in the initial state (at the time of no voltage application) is formed on the overall upper surface of the glass substrate 21.

In this fashion, the TFT substrate of the liquid crystal display device is completed.

The opposing substrate of the liquid crystal display device is formed by the well-known method. In other words, the black matrix for shielding the areas between the pixels from the light is formed by Cr (chromium), for example, on the glass substrate. Also, the color filters of the red color, the green color, and the blue color are formed on the glass substrate such that the color filter having any one color of the red color, the green color, and the blue color is arranged every pixel. Then, the transparent electrode made of the ITO film is formed on the overall upper surface of the glass substrate, and the alignment film is formed on the transparent electrode.

The liquid crystal display panel is formed by pasting together the TFT substrate and the opposing substrate, which is manufactured in this manner, and then confining the liquid crystal in a space between them. Then, the liquid crystal display device is completed by arranging the polarization plate on both surfaces of this liquid crystal display panel and arranging the backlight on the back surface side.

Fifth Embodiment

Next, there will be explained a structure of a liquid crystal display device into which thin film transistor devices according to a fifth embodiment of the present invention are installed with reference to the drawings hereunder.

Like the liquid crystal display device according to the fourth embodiment, the liquid crystal display device according to the fifth embodiment comprises the TFT in the thin thickness portion formed on the substrate, the TFT in the thick thickness portion, the pixel electrode 110 (90) and the data bus line 108 (88c) connected to the source/drain regions of the TFT in the thick thickness portion, the gate bus line 109 (84a) connected to the gate electrode of the TFT in the thick thickness portion, and the storage capacitor bus line 111 (82c) that intersect with the pixel electrode 90.

A difference from the fourth embodiment is the display portion, particularly the structure of the storage capacitor element that is attached to the storage capacitor bus line 111 82c.

Figure 20:
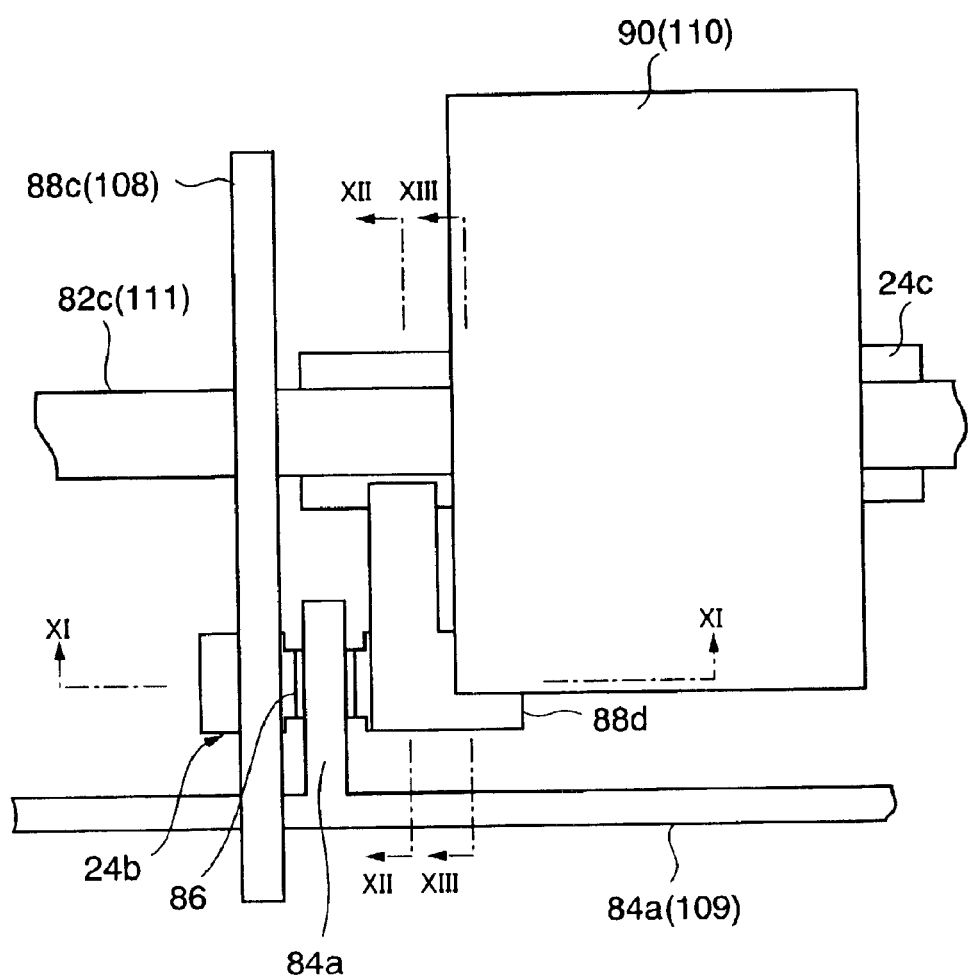
FIG. 20 is a plan view showing a liquid crystal display device having a thin film transistor device according to a fifth embodiment of the present invention.

FIG. 20 is a plan view showing a structure of one pixel of the display portion of the liquid crystal display device according to the fifth embodiment of the present invention when viewed from the upper side. A sectional view taken along a XI—XI line of FIG. 20 is a cross section of the TFT and is shown in the right-side view of FIG. 14F. FIG. 21A are sectional views taken along a XII—XII line of FIG. 20, and FIG. 21B are sectional views taken along a XIII—XIII line of FIG. 20.

Since the TFT in the thin thickness portion and the TFT in the thick thickness portion out of the constituent elements of the display device have the same structures as those of the fourth embodiment, their detailed explanation will be omitted herein.

As shown in FIGS. 21A and 21B, the storage capacitor bus line 82c (111) is formed of the first Al—Nd film (first conductive film), which is the same material as the first gate electrode 82 of the TFT in the thin thickness portion. The storage capacitor element having the storage capacitor bus line 82c as one electrode is provided to a partial area of the line. The storage capacitor element is constructed by one electrode made of the storage capacitor bus line 82c, the capacitor insulating film made of the first silicon oxide film 81e that is the same material as the first gate insulating film 81a of the TFT in the thin thickness portion, and the other electrode made of the third island-like semiconductor film 24c that is the same material as the first and second island-like semiconductor films 24a, 24b. A pair of p-type impurity regions are formed in the third island-like semiconductor film 24c on both sides of the storage capacitor bus line 82c. Any one of a pair of p-type impurity regions is connected to the pixel electrode 90. In other words, there is constructed the same structure as the p-channel type third thin film transistor, which has the storage capacitor bus line 82c as the third gate electrode, the first silicon oxide film 81e as the third gate insulating film, the third island-like semiconductor film 24c as the operating layer, and a pair of p-type impurity regions as the source/drain regions.

Here, the reason why the p-channel type third thin film transistor is employed will be given as follows. That is, if the n-channel type TFT is used as the pixel TFT, the ON current is high and a quantity of storage charge of the pixel is ready to increase. Also, if the n-channel type TFT is used as the pixel TFT and also a structure shown in FIGS. 17A and 17B is employed to prevent the influence of the parasitic TFT, it is preferable that the applied voltage to the electric-field relaxation electrodes 82a, 82b of the pixel TFT should be set negative. In addition, if the electric-field relaxation electrodes 82a, 82b of the pixel TFT and the gate electrode (storage capacitor bus line) 82c of the storage capacitor element are set to the identical potential, the number of the power supply can be reduced. With the above, since the negative potential is applied to the gate electrode (storage capacitor bus line) 82c of the storage capacitor element, the state that the channel is always turned ON can be held if the third thin film transistor is constructed by the p-channel type TFT. That is, the third island-like semiconductor film 24c can be employed as the electrode.

Next, the liquid crystal display device manufacturing method according to the fifth embodiment will be explained hereunder. Here, the thin film transistor device manufacturing method according to the third embodiment is applied to the formation of the thin film transistor device. In this case, the storage capacitor bus line 82c, etc. are formed by the steps that are common to the steps of forming the gate electrode of the TFT, etc., as described in the following.

The third island-like semiconductor film 24c is formed by the patterning at the same time when the first and second island-like semiconductor films 24a, 24b are formed. The gate insulating film made of the first silicon oxide film 81e is formed by the patterning at the same time when the first gate insulating film 81a and a part of the second gate insulating film 86 are formed by patterning the first silicon oxide film 81. The storage capacitor bus line 82c is formed by the patterning at the same time when the first gate electrode 82 is formed by patterning the first Al—Nd film.

Then, the via hole 89a is formed on the source/drain electrode 88d by patterning the silicon nitride film 89 subsequently to the step of forming the silicon nitride film 89, which is explained in the third embodiment. Then, the ITO film of 100 nm thickness is formed by PVD method, and then the pixel electrode 90 is formed by patterning the ITO film.

Then, the alignment film (not shown) that decides the alignment direction of the liquid crystal molecule in the initial state (at the time of no voltage application) is formed on the overall upper surface of the glass substrate 21.

In this fashion, the TFT substrate of the liquid crystal display device is completed.

The opposing substrate of the liquid crystal display device is formed by the well-known method. In other words, the black matrix for shielding the areas between the pixels from the light is formed by Cr (chromium), for example, on the glass substrate. Also, the color filters of the red color, the green color, and the blue color are formed on the glass substrate such that the color filter having any one color of the red color, the green color, and the blue color is arranged every pixel. Then, the transparent electrode made of the ITO film is formed on the overall upper surface of the glass substrate, and the alignment film is formed on the transparent electrode.

The liquid crystal display panel is constructed by pasting together the TFT substrate and the opposing substrate, which is manufactured in this manner, and then confining the liquid crystal in a space between them. Then, the liquid crystal display device is completed by arranging the polarization plate on both surfaces of this liquid crystal display panel and arranging the backlight on the back surface side.

As described above, according to the fifth embodiment of the present invention, the storage capacitor element constructed by following elements is provided. In other words, the storage capacitor element has one electrode utilizing the storage capacitor bus line 108 that is formed of the same material as the first gate electrode 82 of the TFT in the thin thickness portion, the capacitor insulating film 81e formed of the same material as the first insulating film 81b of the second gate insulating film 86, and the other electrode formed of the same material as the first and second island-like semiconductor films 24a, 24b.

Accordingly, since normally the gate insulating film is formed thin, the storage capacitor element having the higher capacitance value per unit area can be obtained in comparison with the storage capacitor element, which has the ITO film as the other electrode and has the interlayer insulating film as the capacitor insulating film. Thus, since the area of the storage capacitor bus line 108 necessary to form the storage capacitor, i.e., the light shielding area, can be reduced, the aperture ratio can be improved.

Also, if the pixel TFT is formed to have the electric-field relaxation electrodes 82a, 82b in FIGS. 17A and 17B, the voltage can be supplied to the gate electrode 82c of the storage capacitor element and the electric-field relaxation electrodes 82a, 82b from one storage capacitor bus line 82c. As a result, there is no need to increase the extra wirings that supply the voltage to the gate electrode 82c of the storage capacitor element and the electric-field relaxation electrodes 82a, 82b, the reduction in the aperture ratio can be prevented.

With the above, the present invention is explained particularly based on the embodiments. But the present invention is not limited to the examples that are disclosed particularly in the above embodiments, and also variations of the above embodiments within the scope that does not depart from the gist of the present invention are contained in the scope of the present invention.

For example, the thin film transistor device is applied to the liquid crystal display device in the above. But such thin film transistor device may also be applied to the organic EL display device.

Also, the transparent substrate in which the silicon nitride film and the silicon oxide film are laminated on the glass substrate is employed as the substrate. However, except the case where the manufacturing method has the step of irradiating the exposure light from the back surface, the opaque substrate can be employed.

What is claimed is:

1. A liquid crystal display device comprising:

a first thin film transistor;

a second thin film transistor, the first thin film transistor and the second thin film transistor being formed on a substrate;

a pixel electrode connected to source/drain regions of the second thin film transistor; and a storage capacitor bus line that intersects with the pixel electrode;

wherein the first thin film transistor includes a first island-like semiconductor film having a pair of source/drain regions formed to put a channel region therebetween, a first gate insulating film made of a first insulating film formed on the channel region of the first island-like semiconductor film, and a first gate electrode made of a first conductive film formed on the first gate insulating film, the second thin film transistor includes a second island-like semiconductor film having a pair of source/drain regions formed to put a channel region therebetween and any one of which is connected to the pixel electrode, a second gate insulating film made of the first insulating film and a second insulating film formed on the channel region of the second island-like semiconductor film, and a second gate electrode made of a second conductive film formed on the second gate insulating film, and the storage capacitor bus line is formed of the first conductive film, and the second insulating film and the second conductive film connected to the pixel electrode are laminated in this order in a partial area on the storage capacitor bus line.

2. A liquid crystal display device comprising:

a first thin film transistor;

a second thin film transistor, the first thin film transistor and the second thin film transistor being formed on a substrate;

a pixel electrode connected to any one of source/drain regions of the second thin film transistor; and a storage capacitor bus line that intersects with the pixel electrode;

wherein the first thin film transistor includes a first island-like semiconductor film having a pair of source/drain regions formed to put a channel region therebetween, a first gate insulating film made of a first insulating film formed on the channel region of the first island-like semiconductor film, and a first gate electrode made of a first conductive film formed on the first gate insulating film, the second thin film transistor includes a second island-like semiconductor film having a pair of source/drain regions formed to put a channel region therebetween and any one of which is connected to the pixel electrode, a second gate insulating film made of the first insulating film and a second insulating film formed on the channel region of the second island-like semiconductor film, and a second gate electrode made of a second conductive film formed on the second gate insulating film, and the storage capacitor bus line is formed of the first conductive film, and is provided in a partial area thereof with a third thin film transistor including a gate electrode formed of the storage capacitor bus line, a third island-like semiconductor film having source/drain regions any one of which is connected to the pixel electrode, and a gate insulating film made of the first insulating film.

3. A liquid crystal display device according to claim 2, wherein the first thin film transistor and the second thin film transistor are an n-channel type transistor, and the third thin film transistor is a p-channel type transistor.

4. A liquid crystal display device according to claim 2, wherein the first thin film transistor, the second thin film transistor, and the third thin film transistor are formed of a same semiconductor film.

* * * * *

UNITED STATES PATENT AND TRADEMARK OFFICE
CERTIFICATE OF CORRECTION

PATENT NO. : 6,900,464 B2  Page 1 of 1
APPLICATION NO. : 10/314880
DATED : May 31, 2005
INVENTOR(S) : Hirano et al.

It is certified that error appears in the above-identified patent and that said Letters Patent is hereby corrected as shown below:

On the Title page:

Item (75) Inventors, delete "Seiji Doi, Kawasaki (JP); Kazushige Hotta, Kawasaki (JP)".

Signed and Sealed this

Twenty-ninth Day of January, 2008

JON W. DUDAS
*Director of the United States Patent and Trademark Office*